United States Patent
Chung et al.

(10) Patent No.: US 12,408,466 B2
(45) Date of Patent: Sep. 2, 2025

(54) HIGH-SPEED READOUT IMAGE SENSOR

(71) Applicant: Taiwan Semiconductor Manufacturing Company, Ltd., Hsinchu (TW)

(72) Inventors: Chi-Hsien Chung, New Taipei (TW); Tzu-Jui Wang, Fengshan (TW); Shang-Fu Yeh, Hsin Chu (TW); Tzu-Hsuan Hsu, Kaohsiung (TW); Chen-Jong Wang, Hsin-Chu (TW); Dun-Nian Yaung, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 407 days.

(21) Appl. No.: 18/149,746

(22) Filed: Jan. 4, 2023

(65) Prior Publication Data
US 2024/0014245 A1    Jan. 11, 2024

Related U.S. Application Data

(60) Provisional application No. 63/431,059, filed on Dec. 8, 2022, provisional application No. 63/359,981, filed on Jul. 11, 2022.

(51) Int. Cl.
H10F 39/00 (2025.01)
(52) U.S. Cl.
CPC ......... *H10F 39/811* (2025.01); *H10F 39/809* (2025.01); *H01L 2225/06544* (2013.01)
(58) Field of Classification Search
CPC .............................. H10F 39/811; H10F 39/809
See application file for complete search history.

(56) References Cited

U.S. PATENT DOCUMENTS

| | | |
|---|---|---|
| 2010/0276572 A1 | 11/2010 | Iwabuchi et al. |
| 2013/0320194 A1 | 12/2013 | Chen et al. |
| 2014/0211056 A1 | 7/2014 | Fan |
| 2014/0240566 A1 | 8/2014 | Shizukuishi |
| 2016/0181226 A1 | 6/2016 | Wan |
| 2017/0373114 A1 | 12/2017 | Wan |
| 2018/0240797 A1 | 8/2018 | Yokoyama et al. |
| 2018/0286910 A1 | 10/2018 | Kobayashi |

(Continued)

FOREIGN PATENT DOCUMENTS

| | | |
|---|---|---|
| JP | 2014107448 A | 6/2014 |
| JP | 2021136590 A | 9/2021 |

*Primary Examiner* — Amar Movva
(74) *Attorney, Agent, or Firm* — Eschweiler & Potashnik, LLC

(57) ABSTRACT

Various embodiments of the present disclosure are directed towards an image sensor. The image sensor includes a first chip bonded to a second chip. The first chip includes a semiconductor substrate. The first chip includes a first transistor cell and a second transistor cell. The second transistor cell is laterally spaced from the first transistor cell. A first through-substrate via (TSV) extends vertically through the semiconductor substrate. The first transistor cell is electrically coupled to the first TSV. A second TSV extends vertically through the first semiconductor substrate. The second transistor cell is electrically coupled to the second TSV. The second chip comprises a first readout circuit that is electrically coupled to the first TSV and the second TSV. The first readout circuit is disposed laterally between the first TSV and the second TSV. The first readout circuit is configured to receive a first signal from the first transistor cell.

20 Claims, 20 Drawing Sheets

(56) References Cited

U.S. PATENT DOCUMENTS

| | | |
|---|---|---|
| 2020/0105815 A1 | 4/2020 | Huang et al. |
| 2021/0375781 A1 | 12/2021 | Lin et al. |
| 2022/0102404 A1 | 3/2022 | Lee et al. |
| 2022/0328419 A1 | 10/2022 | Lin et al. |
| 2022/0392942 A1 | 12/2022 | Tojinbara |
| 2023/0362503 A1 | 11/2023 | Muto et al. |

HIGH-SPEED READOUT IMAGE SENSOR

REFERENCE TO RELATED APPLICATIONS

This application claims the benefit of U.S. Provisional Application No. 63/359,981, filed on Jul. 11, 2022 & U.S. Provisional Application No. 63/431,059, filed on Dec. 8, 2022. The contents of the above-referenced Patent applications are hereby incorporated by reference in their entirety.

BACKGROUND

Many modern-day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
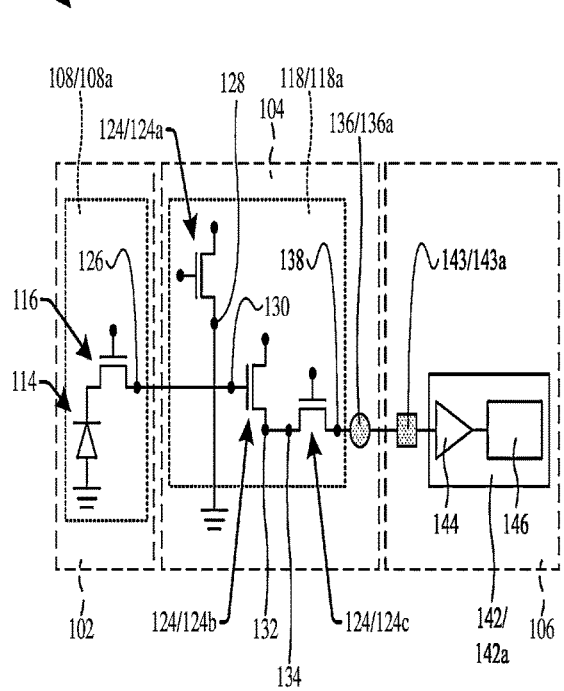
FIGS. 1A-1B illustrate various views of some embodiments of a high-speed readout image sensor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, etc.) include an image sensor for capturing images. One example of such an image sensor is a complementary metal-oxide-semiconductor (CMOS) image sensor (CIS) comprising a first chip, a second chip, and a third chip. The first chip comprises a plurality of photodetector cells. The photodetector cells of the plurality of photodetector cells are disposed in a first array comprising rows and columns (e.g., 1×1 array, 2×2 array, 16×16 array, etc.). Each of the photodetector cells comprises one or more photodetectors disposed in a first semiconductor substrate (e.g., the semiconductor substrate of the first chip) and one or more transfer gates disposed on/over the first semiconductor substrate.

For example, the plurality of photodetector cells may comprise a first photodetector cell and a second photodetector cell. The first photodetector cell may comprise one or more first photodetectors (e.g., 1 photodetector, 2 photodetectors, 16 photodetectors, etc.) and one or more first transfer gates. The second photodetector cell may comprise one or more second photodetectors and one or more second transfer gates.

The second chip comprises a plurality of transistor cells. The transistor cells of the plurality of transistors cells are disposed in a second array comprising rows and columns (e.g., 1×1 array, 2×2 array, 16×16 array, etc.). Each of the plurality of transistor cells comprises a plurality of transistors that are disposed on/over a second semiconductor substrate (e.g., the semiconductor substrate of the second chip) and that are configured to operate one or more corresponding photodetector cells.

For example, the plurality of transistor cells may comprise a first transistor cell and a second transistor cell. The first transistor cell may comprise a first plurality of transistors that are disposed on/over the second semiconductor substrate and that are configured to operate the first photodetector cell. The second transistor cell may comprise a second plurality of transistors that are disposed on/over the second semiconductor substrate and are configured to operate the second photodetector cell.

The third chip comprises a plurality of readout circuits. Each of the plurality of readout circuits comprise one or more readout devices (e.g., transistors) disposed on/over a third semiconductor substrate (e.g., the semiconductor substrate of the third chip). The plurality of readout circuits are electrically coupled to groups of transistor cells of the plurality of transistor cells; and the plurality of readout circuits are configured to receive electrical signals, which correspond to charges accumulated in the plurality of photodetectors, from their corresponding group of transistor cells.

For example, the plurality of readout circuits may comprise a first readout circuit and a second readout circuit. The first readout circuit may comprise one or more first readout devices disposed in the third semiconductor substrate. The first readout circuit is electrically coupled to a first group of transistor cells of the plurality of transistor cells. The first readout circuit is configured to receive electrical signals, which correspond to charges accumulated in the photodetectors that the first group of transistor cells operate, from the first group of transistor cells. In some embodiments, the first group of transistor cells comprises each individual transistor cell that is disposed in a first column of the second array.

The second readout circuit may comprise one or more second readout devices disposed in the third semiconductor substrate. The second readout circuit is electrically coupled to a second group of transistor cells of the plurality of transistor cells. The second readout circuit is configured to receive electrical signals, which correspond to charges accumulated in the photodetectors that the plurality of transistors of the second group of transistor cells operate, from the second group of transistor cells. In some embodiments, the second group of transistor cells comprises each individual transistor cell that is disposed in a second column of the second array.

Further, the second chip comprises an interlayer dielectric (ILD) structure. The plurality of transistor cells are electrically coupled to conductive wires that are disposed in the ILD structure. More specifically, in some embodiments, each of the transistor cells of a given one of the groups of transistor cells is electrically coupled to a corresponding one of the conductive wires. The conductive wires typically run in parallel with one another from a first side of the second chip toward a second side of the second chip.

Moreover, the second chip may comprise a plurality of through-substrate via (TSVs) that extend vertically through the second semiconductor substrate. The plurality of TSVs extend vertically though the second semiconductor substrate. Typically, each of the conductive wires is electrically coupled to a single one of the plurality of TSVs; and each of the plurality of TSVs provides an electrical connection between one of the conductive wires (of the second chip) and one of the plurality of readout circuits. Further, the plurality of TSVs are generally disposed in a peripheral region of the second chip that extends along an outermost sidewall of the second semiconductor substrate.

For example, a first conductive wire and a second conductive wire may be disposed in the ILD structure. Each of the transistor cells of the first group of transistor cells are electrically coupled to the first conductive wire. Each of the transistor cells of the second group of transistor cells are electrically coupled to the second conductive wire. The plurality of TSVs comprise a first TSV and a second TSV that extend vertically through the second semiconductor substrate. The first TSV is electrically coupled to the first conductive wire; and the first TSV electrically couples the first conductive wire to the first readout circuit. The second TSV is electrically coupled to the second conductive wire; and the second TSV electrically couples the second conductive wire to the second readout circuit. The first TSV and the second TSV are laterally spaced from one another. The first TSV and the second TSV are both disposed in the peripheral region of the second chip.

Because the plurality of transistor cells are electrically coupled to the conductive wires, and because the plurality of TSVs are disposed in the peripheral region of the second chip, the conductive wires are relatively long (e.g., extend a relatively long lateral distance across the second chip). More specifically, the plurality of transistor cells generally comprise a large number of transistor cells, thereby resulting in the plurality of transistor cells consuming a large area of the second chip. Further, because each of the plurality of TSVs provides an electrical connection between one of the conductive wires (of the second chip) and one of the plurality of readout circuits, the conductive wires are relatively long to ensure the plurality of transistor cells may be electrically coupled to the plurality TSVs. Because the conductive wires are relatively long, and because each of the plurality of TSVs provides an electrical connection between one of the conductive wires (of the second chip) and one of the plurality of readout circuits, a typical image sensor may have a relatively high RC delay, thereby resulting in the typical image sensor having a slow readout speed (e.g., long output signal settling time, decreased chip speed, etc.).

As another more specific example, in some embodiments, the plurality of transistor cells may comprise the first transistor cell, the second transistor cell, a third transistor cell, and a fourth transistor cell. The first transistor cell and the second transistor cell may be disposed in the first column of the second array; and the third transistor cell and the fourth transistor cell may be disposed in the second column of the second array. The first transistor cell and the third transistor cell may be disposed in a first row of the second array; and the second transistor cell and the fourth transistor cell may be disposed in a second row of the second array. The first row of the second array may be an outermost row on a first side of the second array; and the second row of the second array may be an outermost row on a second side of the second array opposite the first side of the second array (e.g., the first row of the second array is spaced further from the second row of the second array than any other of the rows of the second array). The first TSV and the second TSV may be disposed outside the second array and on a same side of the second array (e.g., in the peripheral region which is outside the second array and along the first side of the second array). The first conductive wire may be electrically coupled to the first transistor cell, the second transistor cell, and the first TSV; and the second conductive wire may be electrically coupled to the third transistor cell, the fourth transistor cell, and the second TSV. The first TSV may electrically couple the first conductive wire to the first readout circuit; and the second TSV may electrically couple the second conductive wire to the first readout circuit.

Because the first transistor cell, the second transistor cell, and the first TSV are electrically coupled to the first conductive wire, and because of the relatively large spacing between such structures (e.g., the first transistor cell is spaced relatively far from the second transistor cell, and the first TSV is disposed in the peripheral region which is along the first side of the second array), the first conductive wire is relatively long. For a similar reason, the second conductive wire is also relatively long. Because the first and second conductive wires are relatively long, and because the first TSV provides an electrical connection between the first conductive wire and (only) the first readout circuit and the second TSV provides an electrical connection between the second conductive wire and (only) the second readout circuit, the typical image sensor may have a relatively high RC delay, thereby resulting in the typical image sensor having the slow readout speed.

Various embodiments of the present disclosure are related to a high-speed readout image sensor. The high-speed readout image sensor comprises a first chip and a second chip that is bonded to the first chip. The first chip comprises a first semiconductor substrate. The first chip also comprises a first transistor cell and a second transistor cell disposed in a transistor cell array. The first transistor cell comprises a first plurality of transistors disposed on the first semiconductor substrate. The first transistor cell is configured to operate a first photodetector cell. The second transistor cell comprises a second plurality of transistors disposed on the first semiconductor substrate. The second transistor cell is configured to operate a second photodetector cell. In some embodiments, a third chip of the high-speed readout image sensor comprises the first photodetector cell and the second photodetector cell.

The first chip also comprises a first through-substrate via (TSV) that extends vertically through the first semiconductor substrate. The first transistor cell is electrically coupled to the first TSV. The first transistor cell is configured to provide a first signal to the first TSV that corresponds to a number of charges accumulated in a photodetector of the first photodetector cell.

The first chip also comprises a second TSV that extends vertically through the first semiconductor substrate. The second transistor cell is electrically coupled to the second TSV. The second transistor cell is configured to provide a second signal to the second TSV that corresponds to a number of charges accumulated in a photodetector of the second photodetector cell.

The second chip comprises a second semiconductor substrate. The second chip also comprises an interlayer dielectric (ILD) structure disposed vertically between the second semiconductor substrate and first semiconductor substrate. The second chip also comprises a readout circuit that is electrically coupled to the first TSV and the second TSV. The readout circuit is configured to receive the first signal and the second signal. The readout circuit is disposed laterally, at least partially, between the first TSV and the second TSV.

Because the readout circuit is disposed laterally, at least partially, between the first TSV and the second TSV, overall lengths of the conductive paths that electrically couple the first transistor cell and the second transistor cell to the readout circuit may be relatively small (e.g., a total length of the conductive paths may be less than (e.g., 50% less than) a total length of corresponding conductive paths of the typical image sensor). Because the overall lengths of the conductive paths that electrically couple the first transistor cell and the second transistor cell to the readout circuit are relatively small, the high-speed readout image sensor may have a relatively low RC delay, thereby resulting in the high-speed readout image sensor having a fast readout speed (e.g., quick output signal settling time, increased chip speed, etc.).

Figure 1B:
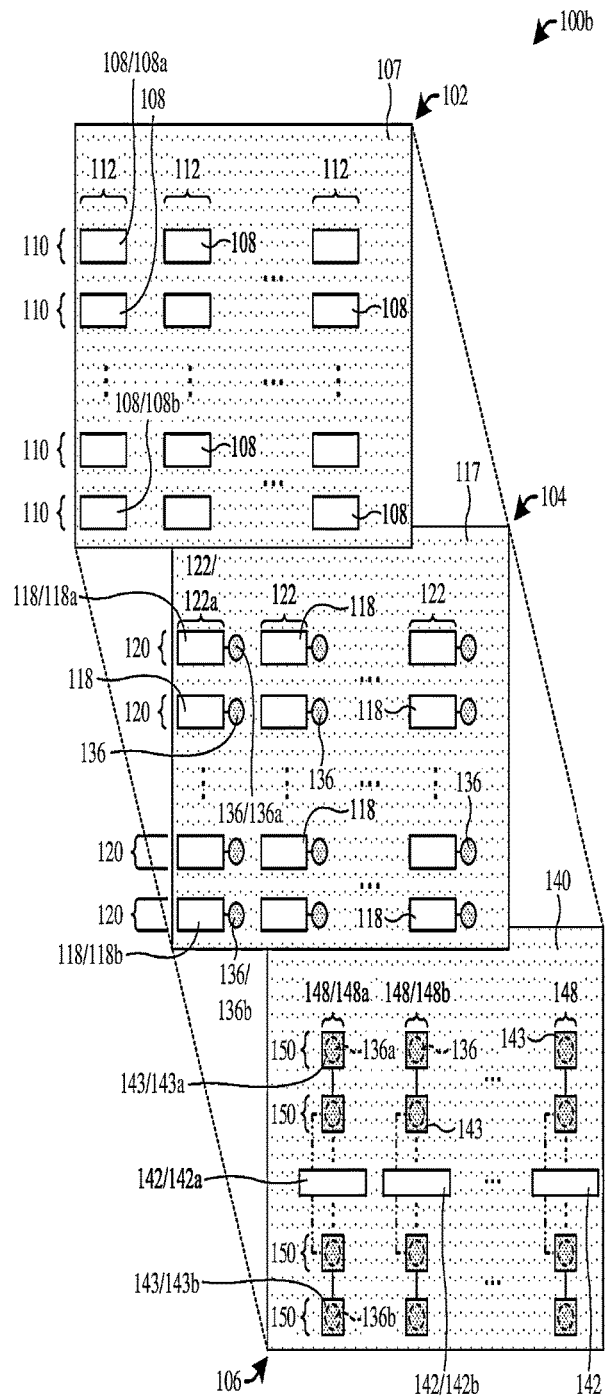

FIGS. 1A-1B illustrate various views 100a-100b of some embodiments of a high-speed readout image sensor. FIG. 1A illustrates a schematic diagram 100a of some embodiments of the high-speed readout image sensor. FIG. 1B illustrates a layout diagram 100b of some embodiments of the high-speed readout image sensor.

As shown in the various views 100a-100b of FIGS. 1A-1B, the high-speed readout image sensor comprises a first chip 102, a second chip 104, and a third chip 106. The first chip 102 is bonded to the second chip 104, and the second chip 104 is bonded to the third chip 106. In some embodiments, the second chip 104 is disposed vertically between (e.g., sandwiched between) the first chip 102 and the third chip 106.

The first chip 102 comprises a first semiconductor substrate 107. The first semiconductor substrate 107 may comprise any type of semiconductor body (e.g., monocrystalline silicon/CMOS bulk, germanium (Ge), a group III-V semiconductor material, silicon-germanium (SiGe), silicon on insulator (SOI), etc.). The first chip 102 comprises a plurality of photodetector cells 108 disposed on the first semiconductor substrate 107. For clarity in the figures, only some of the plurality of photodetector cells 108 are labeled. The plurality of photodetector cells 108 are laterally spaced. In some embodiments, the photodetector cells of the plurality of photodetector cells 108 are disposed in a first array. The first array comprises a first plurality of rows 110 and a first plurality of columns 112. Each of the photodetector cells of the plurality of photodetector cells 108 comprises one or more photodetectors 114 and one or more transfer gates 116.

The second chip 104 comprises a second semiconductor substrate 117. The second semiconductor substrate 117 may comprise any type of semiconductor body (e.g., monocrystalline silicon/CMOS bulk, germanium (Ge), a group III-V semiconductor material, silicon-germanium (SiGe), silicon on insulator (SOI), etc.). The second chip 104 comprises a plurality of transistor cells 118 disposed on the second semiconductor substrate 117. The plurality of transistor cells 118 are laterally spaced. In some embodiments, the transistor cells of the plurality of transistor cells 118 are disposed in a second array. The second array comprises a second plurality of rows 120 and a second plurality of columns 122. Each of the transistor cells of the plurality of transistor cells 118 comprises a plurality of transistors 124.

The plurality of transistor cells 118 are electrically coupled to the plurality of photodetector cells 108, respectively. For example, the plurality of photodetector cells 108 may comprise a first photodetector cell 108a, a second photodetector cell 108b, and so forth. The plurality of transistor cells 118 may comprise a first transistor cell 118a, a second transistor cell 118b, and so forth. The first transistor cell 118a is electrically coupled to the first photodetector cell 108a; the second transistor cell 118b is electrically coupled to the second photodetector cell 108b; and so forth.

In some embodiments, the plurality of transistor cells 118 are electrically coupled to floating diffusion nodes of the plurality of photodetector cells 108, respectively. In further embodiments, the one or more photodetectors 114 are configured to absorb incident radiation (e.g., light) and generate electrical signals corresponding to the incident radiation. In yet further embodiments, the one or more transfer gates 116 are configured to transfer accumulated charges from a corresponding photodetector to a corresponding floating diffusion node. For example, a first one of the one or more transfer gates 116 of the first photodetector cell 108a is configured to transfer charges accumulated in a first one of the one or more photodetectors 114 of the first photodetector cell 108a to a floating diffusion node 126 of the first photodetector cell 108a.

The plurality of transistor cells 118 are configured to operate (e.g., access, select, reset, etc.) the plurality of photodetector cells 108, respectively. For example, the first transistor cell 118a is configured to operate the first photodetector cell 108a; the second transistor cell 118b is configured to operate the second photodetector cell 108b; and so forth. The plurality of transistor cells 118 correspond to the plurality of photodetector cells 108 in which they are configured to operate. For example, the first transistor cell 118a corresponds to the first photodetector cell 108a; the second transistor cell 118b corresponds to the second photodetector cell 108b; and so forth.

In some embodiments, the plurality of transistors comprise a first transistor 124a, a second transistor 124b, and a third transistor 124c. In some embodiments, the first transistor 124a is a reset transistor. In some embodiments, the second transistor 124b is a source-follower transistor. In some embodiments, the third transistor 124c is a select transistor (e.g., row select transistor).

In some embodiments, a first source/drain node 128 of the first transistor 124a is electrically coupled to a gate 130 of the second transistor 124b. In further embodiments, the first source/drain node 128 and the gate 130 are electrically coupled to the floating diffusion node 126 of their corresponding photodetector cell. For example, the first source/drain node 128 of the first transistor 124a of the first transistor cell 118a and the gate 130 of the second transistor 124b of the first transistor cell 118a are both electrically coupled to the floating diffusion node 126 of the first photodetector cell 108a. In some embodiments, a first source/drain node 132 of the second transistor 124b is electrically coupled to a first source/drain node 134 of the third transistor 124c.

The second chip 104 comprises a plurality of through-substrate vias (TSVs) 136. For clarity in the drawings, only some of the plurality of TSVs 136 are labeled. The plurality of TSVs 136 extend vertically through the second semiconductor substrate 117. The plurality of TSVs 136 are electrically coupled to the plurality of transistor cells 118, respectively. For example, the plurality of TSVs 136 comprise a first TSV 136a, a second TSV 136b, and so forth. The first TSV 136a is electrically coupled to the first transistor cell 118a; the second TSV 136b is electrically coupled to the second transistor cell 118b; and so forth. In some embodiments, the plurality of TSVs 136 are electrically coupled to a second source/drain node 138 of the third transistor 124c of their corresponding transistor cell. For example, the first TSV 136a may be electrically coupled to the second source/drain node 138 of the third transistor 124c of the first transistor cell 118a; the second TSV 136b may be electrically coupled to a second source/drain node 138 of the third transistor 124c of the second transistor cell 118b; and so forth. In some embodiments, the plurality of TSVs 136 are or comprise, for example, copper (Cu), aluminum (Al), gold (Au), silver (Ag), platinum (Pt), polysilicon, some other conductive material, or a combination of the foregoing.

The plurality of transistor cells 118 are configured to provide signals to the plurality of TSVs 136 that correspond to a number of charges accumulated in the one or more photodetectors of their corresponding photodetector cell. For example, the first transistor cell 118a is configured to provide one or more first signals to the first TSV 136a that correspond to charges accumulated in the one or more photodetectors 114 of the first photodetector cell 108a; the second transistor cell 118b is configured to provide one or more second signals to the second TSV 136b that correspond to charges accumulated in the one or more photodetectors 114 of the second photodetector cell 108b; and so forth.

In some embodiments, the first TSV 136a and the second TSV 136b are spaced further apart than any other TSV of the plurality of TSVs 136 that are disposed in a same column as the first TSV 136a and the second TSV 136b. In other embodiments, the first TSV 136a may neighbor the second TSV 136b. In further embodiments, the plurality of TSVs 136 may be laterally spaced from each of the edges (e.g., outermost sidewalls) of the second semiconductor substrate 117 by at least about 500 micrometers (μm). In yet further embodiments, the plurality of TSVs 136 may be laterally spaced from each of the edges (e.g., outermost sidewalls) of the second semiconductor substrate 117 by at least about 2000 μm.

The third chip 106 comprises a third semiconductor substrate 140. The third semiconductor substrate 140 may comprise any type of semiconductor body (e.g., monocrystalline silicon/CMOS bulk, germanium (Ge), a group III-V semiconductor material, silicon-germanium (SiGe), silicon on insulator (SOI), etc.). The third chip 106 comprises a first plurality of readout circuits 142. In some embodiments, each of the first plurality of readout circuits 142 may comprise an amplifier circuit 144. In further embodiments, each of the first plurality of readout circuits 142 may comprise an analog-to-digital converter (ADC) 146. In some embodiments, the amplifier circuit 144 is electrically coupled to the ADC 146.

The third chip 106 also comprises a first plurality of conductive bond structures 143. The first plurality of conductive bond structures 143 are electrically coupled to the plurality of TSVs 136, respectively. For example, a first conductive bond structure 143a is electrically coupled to the first TSV 136a; a second conductive bond structure 143b is electrically coupled to the second TSV 136b; and so forth. For clarity in the figures, only some of the first plurality of conductive bond structures 143 are labeled. In some embodiments, the first plurality of conductive bond structures 143 may be or comprise, for example, copper (Cu), aluminum (Al), tungsten (W), gold (Au), some other conductive material, or a combination of the foregoing.

In some embodiments, the first plurality of conductive bond structures 143 are disposed in a third array. The third array comprises a third plurality of rows 150 and a third plurality of columns 148. For clarity in the figures, the plurality of TSVs 136 are illustrated in phantom (via dotted lines) on the third chip 106. It will be appreciated that the plurality of TSVs 136 may also be disposed in an array (e.g., a fourth array comprising a fourth plurality of rows and a fourth plurality of columns), as shown in the layout diagram 100b of FIG. 1B.

The first plurality of conductive bond structures 143 are electrically coupled to the first plurality of readout circuits 142. More specifically, in some embodiments, the conductive bond structures of the first plurality of conductive bond structures 143 of a given column of the third plurality of columns 148 are electrically coupled to a corresponding one of the first plurality of readout circuits 142. For example, in some embodiments, each of the first plurality of conductive bond structures 143 that are disposed in a first column 148a of the third plurality of columns 148 are electrically coupled to a first readout circuit 142a of the first plurality of readout circuits 142; each of the first plurality of conductive bond structures 143 that are disposed in a second column 148b of the third plurality of columns 148 are electrically coupled to a second readout circuit 142b of the first plurality of readout circuits 142; and so forth. It will be appreciated that the ellipsis symbols ( . . . ) shown in figures illustrate that the first chip 102, the second chip 104, and/or the third chip 106 may be larger than illustrated and may comprise additional iterations of the features (e.g., additional TSVs, additional photodetectors cells, additional transistors cells, etc.) illustrated in the figures.

In some embodiments, the conductive bond structures of the first plurality of conductive bond structures 143 of a given column of the third plurality of columns 148 are electrically coupled via a corresponding conductive feature (e.g., conductive wire) of the third chip 106. For example, in some embodiments, each of the first plurality of conductive bond structures 143 that are disposed in the first column 148a are electrically coupled via a first conductive feature of the third chip 106 (e.g., first conductive wire of an interconnect structure of the third chip); each of the first plurality of conductive bond structures 143 that are disposed in the second column 148b are electrically coupled via a second conductive feature of the third chip 106 (e.g., second conductive wire of the interconnect structure of the third chip); and so forth. It will be appreciated that the solid lines extending between some of the first plurality of conductive bond structures 143 illustrates that such conductive bond structures are electrically coupled. It will also be appreciated that the dotted lines extending from some of the first plurality of conductive bond structures 143 to the first plurality of readout circuits 142 illustrate that such conductive bond structures are electrically coupled to the first plurality of readout circuits 142. It will also be appreciated that the dotted lines extending from some of the first plurality of conductive bond structures 143 to the first plurality of readout circuits 142 illustrate that such conductive bond structures may be electrically coupled to additional conductive bond structures (not shown, but appreciated that they may exist due to the ellipsis symbols) that are disposed laterally between such conductive bond structures and the first plurality of readout circuits 142.

Because the first plurality of conductive bond structures 143 are electrically coupled to the plurality of TSVs 136 and electrically coupled to the first plurality of readout circuits 142, the plurality of transistor cells 118 are also configured to provide the signals (that correspond to a number of charges accumulated in the one or more photodetectors of their corresponding photodetector cell) to the first plurality of readout circuits 142. More specifically, in some embodiments, the transistor cells of the plurality of transistor cells 118 of a given column of the second plurality of columns 122 are configured to provide the signals to a corresponding readout circuit. For example, the first transistor cell 118a is configured to provide the one or more first signals that correspond to charges accumulated in the one or more photodetectors 114 of the first photodetector cell 108a to the first readout circuit 142a (via the first TSV 136a); the second transistor cell 118b is configured to provide the one or more second signals that correspond to charges accumulated in the one or more photodetectors 114 of the second photodetector cell 108b to the first readout circuit 142a (via the second TSV 136b); and so forth.

Also shown in the layout diagram 100b of FIG. 1B, the first plurality of readout circuits 142 are laterally disposed, at least partially, between the first TSV 136a and the second TSV 136b. Because the first plurality of readout circuits 142 are disposed laterally, at least partially, between the first TSV 136a and the second TSV 136b, overall lengths of the conductive paths that electrically couple the plurality of transistor cells 118 to their corresponding one of the first plurality of readout circuits 142 may be relatively small (e.g., a total length of the conductive paths may be less than (e.g., 50% less than) a total length of corresponding conductive paths of a typical image sensor). Because the overall lengths of the conductive paths are relatively small, and because the first plurality of readout circuits 142 are configured to receive signals (that correspond to charges accumulated in photodetectors) from the plurality of transistor cells 118, the high-speed readout image sensor may have a relatively low RC delay, thereby resulting in the high-speed readout image sensor having a fast readout speed (e.g., quick output signal settling time, increased chip speed, etc.).

For example, because of the first TSV 136a, and because the first readout circuit 142a is disposed laterally between the first TSV 136a and the second TSV 136b, a relatively small first conductive path exists between the first transistor cell 118a and the first readout circuit 142a. Further, because of the second TSV 136b, and because the first readout circuit 142a is disposed laterally between the first TSV 136a and the second TSV 136b, a relatively small second conductive path exists between the second transistor cell 118b and the first readout circuit 142a. Therefore, in comparison to a typical image sensor (e.g., one that only comprises one TSV per column of transistor cells), the first readout circuit 142a may receive the one or more first signals (provided via the first transistor cell 118a) and the one or more second signals (provided via the second transistor cell 118b) more quickly, thereby resulting in a lower RC delay.

Figure 2:
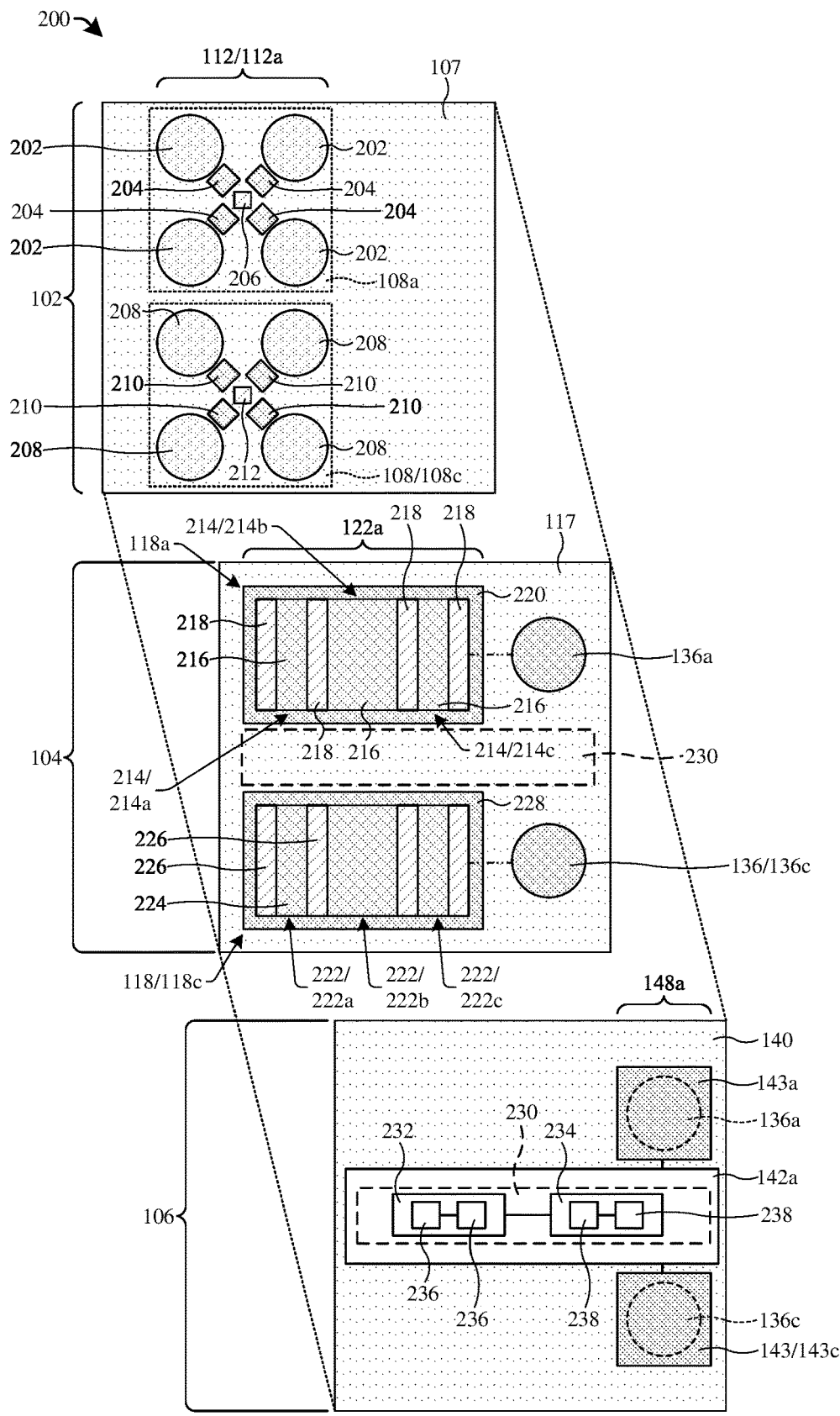
FIG. 2 illustrates a layout view of some embodiments of the high-speed readout image sensor.

FIG. 2 illustrates a layout view 200 of some embodiments of the high-speed readout image sensor. While the layout view 200 illustrates the first chip 102, the second chip 104, and the third chip 106 laterally spaced from one another, it will be appreciated that this is for clarity in the figures and that the first chip 102, the second chip 104, and the third chip 106 may be vertically stacked and bonded together.

As shown in the layout view 200 of FIG. 2, the first chip 102 comprises the first photodetector cell 108a. The first photodetector cell 108a comprises one or more photodetectors 202. In some embodiments, the one or more photodetectors 202 comprise four individual photodetectors, as shown in the layout view 200 of FIG. 2. The one or more photodetectors 202 are configured to absorb the incident radiation (e.g., light) and generate electrical signals corresponding to the incident radiation. It will be appreciated that the one or more photodetectors 202 may comprise any number of individual photodetectors (e.g., 1 photodetector, 2 photodetectors, 16 photodetectors, etc.). It will also be appreciated that, in some embodiments, the one or more photodetectors 202 may be substantially the same (e.g., comprise similar structural features (and/or have a substantially similar layout)) as the one or more photodetectors 114, or vice versa.

The first photodetector cell 108a comprises one or more transfer gates 204 and a floating diffusion node 206. In some embodiments, the one or more transfer gates 204 comprise a same number of individual transfer gates as the one or more photodetectors 202 comprises individual photodetectors. For example, as shown in the layout view 200 of FIG. 2, the one or more transfer gates 204 may comprise four individual transfer gates. It will be appreciated that the one or more transfer gates 204 may comprise any number of individual transfer gates (e.g., 1 transfer gate, 2 transfer gates, 16 transfer gates, etc.). It will also be appreciated that, in some embodiments, the one or more transfer gates 204 may be substantially the same (e.g., comprise similar structural features (and/or have a substantially similar layout)) as the one or more transfer gates 116, or vice versa.

The one or more transfer gates 204 are configured to transfer accumulated charges from a corresponding one of the one or more photodetectors 202 to the floating diffusion node 206. For example, a first individual transfer gate of the one or more transfer gates 204 is configured to transfer accumulated charges from a first individual photodetector of the one or more photodetectors 202 to the floating diffusion node 206; a second individual transfer gate of the one or more transfer gates 204 is configured to transfer accumulated charges from a second individual photodetector of the one or more photodetectors 202 to the floating diffusion node 206; and so forth.

The first chip 102 may also comprise a third photodetector cell 108*c* of the plurality of photodetector cells 108. In some embodiments, the first photodetector cell 108*a* neighbors the third photodetector cell 108*c*. In other embodiments, one or more other photodetector cells are disposed laterally between the first photodetector cell 108*a* and the third photodetector cell 108*c*. In further embodiments, the first photodetector cell 108*a* and the third photodetector cell 108*c* are disposed in a first column 112*a* of the first plurality of columns 112. In yet further embodiments, the first photodetector cell 108*a* may be spaced further from the third photodetector cell 108*c* than any other photodetector cells that are disposed in the first column 112*a*.

The third photodetector cell 108*c* comprises one or more photodetectors 208. In some embodiments, the one or more photodetectors 208 comprise four individual photodetectors, as shown in the layout view 200 of FIG. 2. The one or more photodetectors 208 are configured to absorb the incident radiation (e.g., light) and generate electrical signals corresponding to the incident radiation. It will be appreciated that the one or more photodetectors 208 may comprise any number of individual photodetectors (e.g., 1 photodetector, 2 photodetectors, 16 photodetectors, etc.). It will also be appreciated that, in some embodiments, the one or more photodetectors 208 may be substantially the same (e.g., comprise similar structural features (and/or have a substantially similar layout)) as the one or more photodetectors 114, or vice versa.

The third photodetector cell 108*c* comprises one or more transfer gates 210 and a floating diffusion node 212. In some embodiments, the one or more transfer gates 210 comprise a same number of individual transfer gates as the one or more photodetectors 208 comprises individual photodetectors. For example, as shown in the layout view 200 of FIG. 2, the one or more transfer gates 210 may comprise four individual transfer gates. It will be appreciated that the one or more transfer gates 210 may comprise any number of individual transfer gates (e.g., 1 transfer gate, 2 transfer gates, 16 transfer gates, etc.). It will also be appreciated that, in some embodiments, the one or more transfer gates 210 may be substantially the same (e.g., comprise similar structural features (and/or have a substantially similar layout)) as the one or more transfer gates 116, or vice versa.

The one or more transfer gates 210 are configured to transfer accumulated charges from a corresponding one of the one or more photodetectors 208 to the floating diffusion node 212. For example, a first individual transfer gate of the one or more transfer gates 210 is configured to transfer accumulated charges from a first individual photodetector of the one or more photodetectors 208 to the floating diffusion node 212; a second individual transfer gate of the one or more transfer gates 210 is configured to transfer accumulated charges from a second individual photodetector of the one or more photodetectors 208 to the floating diffusion node 212; and so forth.

In some embodiments, the third photodetector cell 108*c* comprises substantially the same features (e.g., structural features, such as photodetectors, transfer gates, floating diffusion nodes, etc.) and/or has substantially the same layout as the first photodetector cell 108*a*, as shown in the layout view 200 of FIG. 2. In further embodiments, each of the photodetector cells of the plurality of photodetector cells 108 comprise substantially the same features and/or have substantially the same layout.

The second chip 104 comprises the first transistor cell 118*a*. In some embodiments, the first transistor cell 118*a* comprises a first plurality of transistors 214. The first plurality of transistors 214 comprises a first transistor 214*a*, a second transistor 214*b*, and a third transistor 214*c*. In some embodiments, the first transistor 214*a* is a reset transistor. In some embodiments, the second transistor 214*b* is a source-follower transistor. In some embodiments, the third transistor 214*c* is a select transistor (e.g., row select transistor).

The first transistor 214*a*, the second transistor 214*b*, and the third transistor 214*c* each comprise a gate electrode structure 216 overlying a gate dielectric structure (not shown). The gate dielectric structure overlies the second semiconductor substrate 117. In some embodiments, the gate electrode structure 216 is or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing. In further embodiments, the gate dielectric structure is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing.

The first transistor 214*a*, the second transistor 214*b*, and the third transistor 214*c* each comprise source/drain regions 218 disposed on opposite sides of a corresponding gate electrode structure. For example, the first transistor 214*a* comprises source/drain regions 218 disposed on opposite sides of the gate electrode structure of the first transistor 214*a*; the second transistor 214*b* comprises source/drain regions 218 disposed on opposite sides of the gate electrode structure of the second transistor 214*b*; and so forth. The source/drain regions 218 are disposed in the second semiconductor substrate 117. It will be appreciated that the source/drain regions 218 may refer to a source or a drain, individually or collectively dependent upon the context. It will also be appreciated that one or more of the source/drain regions 218 may be shared source/drain regions. It will be appreciated that, in some embodiments, the first plurality of transistors 214 may be substantially the same (e.g., comprise similar structural features (and/or have a substantially similar layout)) as the plurality of transistors 124, or vice versa.

In some embodiments, the first transistor cell 118*a* comprises a first isolation structure 220. The first isolation structure 220 is disposed in the second semiconductor substrate 117. The first isolation structure 220 laterally surrounds the first plurality of transistors 214. In some embodiments, the first isolation structure 220 may be, for example, a shallow trench isolation (STI) structure, a deep trench isolation (DTI) structure, or the like. Also shown in the layout view 200 of FIG. 2, the first TSV 136*a* is electrically coupled to one of the source/drain regions 218 of the third transistor 214*c* (which is illustrated in the layout view 200 of FIG. 2 via a dotted line).

The second chip 104 may also comprise a third transistor cell 118*c* of the plurality of transistor cells 118. In some embodiments, the first transistor cell 118*a* neighbors the third transistor cell 118*c*. In other embodiments, one or more other transistor cells are disposed laterally between the first transistor cell 118a and the third transistor cell 118c. In further embodiments, the first transistor cell 118a and the third transistor cell 118c are disposed in the first column 122a of the second plurality of columns 122. In yet further embodiments, the first transistor cell 118a may be spaced further from the third transistor cell 118c than any other transistor cells that are disposed in the first column 122a.

The third transistor cell 118c comprises a second plurality of transistors 222. The second plurality of transistors 222 comprises a first transistor 222a, a second transistor 222b, and a third transistor 222c. In some embodiments, the first transistor 222a is a reset transistor. In some embodiments, the second transistor 222b is a source-follower transistor. In some embodiments, the third transistor 222c is a select transistor (e.g., row select transistor).

The first transistor 222a, the second transistor 222b, and the third transistor 222c each comprise a gate electrode structure 224 overlying a gate dielectric structure (not shown). The gate dielectric structure overlies the second semiconductor substrate 117. In some embodiments, the gate electrode structure 224 is or comprises, for example, polysilicon, a metal (e.g., aluminum (Al), copper (Cu), titanium (Ti), tantalum (Ta), tungsten (W), molybdenum (Mo), cobalt (Co), or the like, some other conductive material, or a combination of the foregoing. In further embodiments, the gate dielectric structure is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing.

The first transistor 222a, the second transistor 222b, and the third transistor 222c each comprise source/drain regions 226 disposed on opposite sides of a corresponding gate electrode structure. For example, the first transistor 222a comprises source/drain regions 226 disposed on opposite sides of the gate electrode structure of the first transistor 222a; the second transistor 222b comprises source/drain regions 226 disposed on opposite sides of the gate electrode structure of the second transistor 222b; and so forth. The source/drain regions 226 are disposed in the second semiconductor substrate 117. It will be appreciated that the source/drain regions 226 may refer to a source or a drain, individually or collectively dependent upon the context. It will also be appreciated that one or more of the source/drain regions 226 may be shared source/drain regions. It will be appreciated that, in some embodiments, the second plurality of transistors 222 may be substantially the same (e.g., comprise similar structural features (and/or have a substantially similar layout)) as the plurality of transistors 124, or vice versa.

In some embodiments, the third transistor cell 118c comprises a second isolation structure 228. The second isolation structure 228 is disposed in the second semiconductor substrate 117. The second isolation structure 228 laterally surrounds the second plurality of transistors 222. In some embodiments, the second isolation structure 228 may be, for example, a shallow trench isolation (STI) structure, a deep trench isolation (DTI) structure, or the like. Also shown in the layout view 200 of FIG. 2, a third TSV 136c of the plurality of TSVs 136 is electrically coupled to one of the source/drain regions 226 of the third transistor 222c (which is illustrated in the layout view 200 of FIG. 2 via a dotted line).

In some embodiments, the third transistor cell 118c comprises substantially the same features (e.g., structural features, such as first transistor, second transistor, third transistor, isolation structure, etc.) and/or has substantially the same layout as the first transistor cell 118a, as shown in the layout view 200 of FIG. 2. In further embodiments, each of the transistor cells of the plurality of transistor cells 118 comprise substantially the same features and/or have substantially the same layout.

Also shown in the layout view 200 of FIG. 2, the third chip 106 comprises the first readout circuit 142a. The first TSV 136a is electrically coupled to the first conductive bond structure 143a. The third TSV 136c is electrically coupled to a third conductive bond structure 143c of the first plurality of conductive bond structures 143. The first conductive bond structure 143a and the third conductive bond structure 143c are disposed in the first column 148a. The third conductive bond structure 143c and the first conductive bond structure 143a are electrically coupled to the first readout circuit 142a (illustrated by solid lines in the layout view 200 of FIG. 2).

In some embodiments, the first readout circuit 142a comprises an amplifier circuit 232 and an analog-to-digital converter (ADC) 234. The amplifier circuit 232 comprises one or more readout devices 236 (e.g., transistors) that are disposed on the third semiconductor substrate 140. The ADC 234 comprises one or more readout devices 238 (e.g., transistors) that are disposed on the third semiconductor substrate 140. In some embodiments, each of the readout circuits of the first plurality of readout circuits 142 comprise substantially the same features (e.g., structural features, such the amplifier circuit, the ADC, the one or more readout devices, etc.) and/or have substantially the same layout. In some embodiments, the amplifier circuit 232 comprises substantially the same features (e.g., structural features) as the amplifier circuit 144, or vice versa. In some embodiments, the ADC 234 comprises substantially the same features (e.g., structural features) as the ADC 146, or vice versa.

Also shown in the layout view 200 of FIG. 2, a first region 230 of the second chip 104 is disposed laterally between the first transistor cell 118a and the third transistor cell 118c. In some embodiments, the first region 230 of the second chip 104 is also disposed laterally between the first TSV 136a and the third TSV 136c. In some embodiments, the first region 230 of the second chip 104 laterally separates the first transistor cell 118a from the third transistor cell 118c. In some embodiments, the first readout circuit 142a is disposed within a perimeter of the first region 230 of the second chip 104 (which is illustrated in phantom in the third chip 106 for clarity). In further embodiments, the one or more readout devices 236 and/or the one or more readout devices 238 are disposed within the perimeter of the first region 230 of the second chip 104. It will be appreciated that each of the other readout circuits of the first plurality of readout circuits 142 (and their corresponding one or more readout devices) may be disposed within a region of the second chip 104 that is substantially similar to the first region 230 of the second chip 104 (e.g., a region of the second chip disposed laterally between two corresponding transistor cells).

Figure 3:
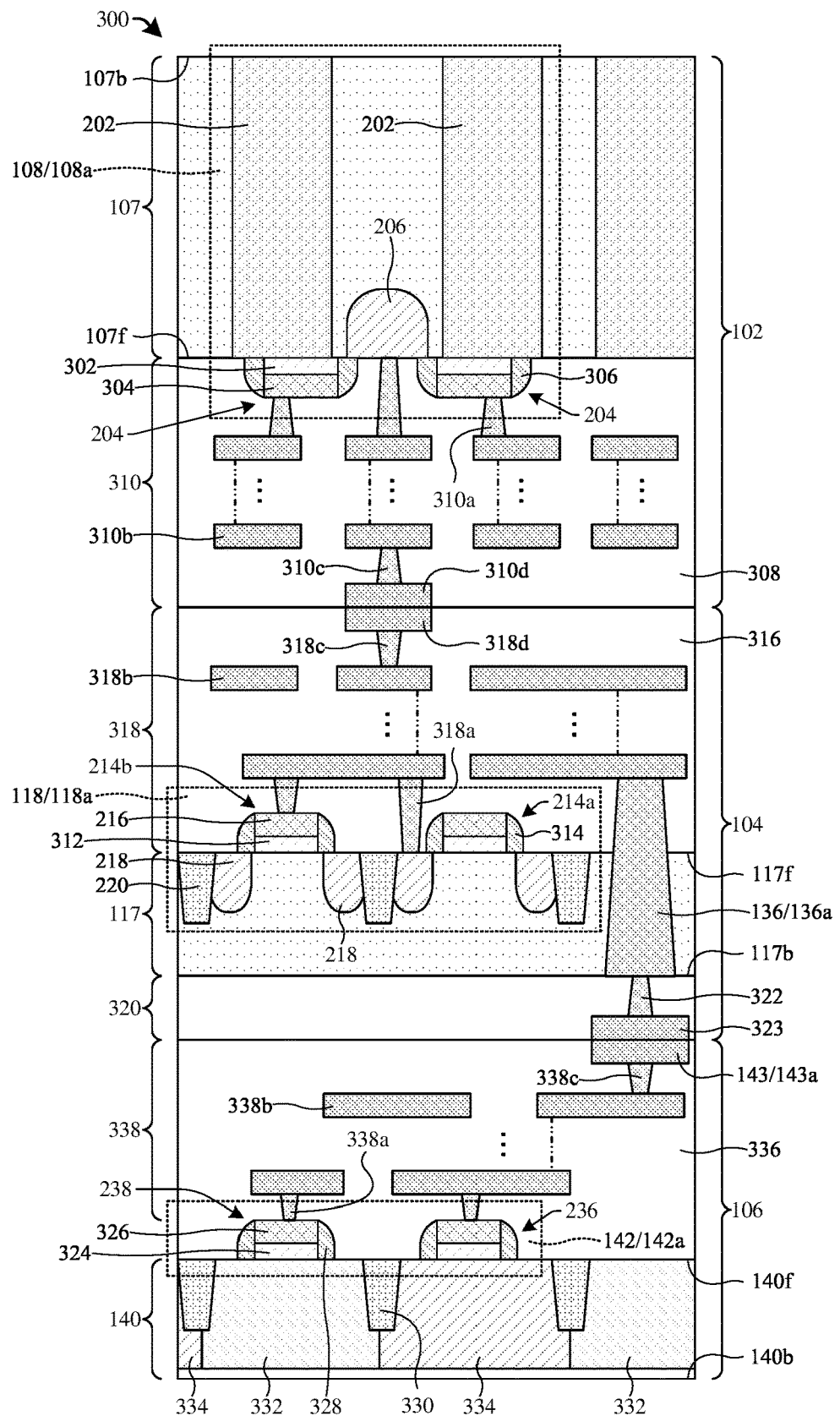
FIG. 3 illustrates a cross-sectional view of some embodiments of the high-speed readout image sensor.

FIG. 3 illustrates a cross-sectional view 300 of some embodiments of the high-speed readout image sensor.

As shown in the cross-sectional view 300 of FIG. 3, the first semiconductor substrate 107 has a front side 107f and a back side 107b opposite the front side 107f. In some embodiments, the front side 107f of the first semiconductor substrate 107 is defined by a first surface (e.g., a front side surface) of the first semiconductor substrate 107, and the back side 107b of the first semiconductor substrate 107 is defined by a second surface (e.g., a back side surface) of the first semiconductor substrate 107 that is opposite the first surface of the first semiconductor substrate 107.

In some embodiments, the high-speed readout image sensor is configured to record incident radiation (e.g., photons) that passes through the back side 107b of the first semiconductor substrate 107 (e.g., backside illumination image sensor). In other embodiments, the image sensor is configured to record incident radiation (e.g., photons) that passes through the front side 107f of the first semiconductor substrate 107 (e.g., front-side illumination image sensor). The first semiconductor substrate 107 may have a first doping type (e.g., p-type/n-type), or may be intrinsic. In other embodiments, the first semiconductor substrate 107 may have a second doping type (e.g., n-type/p-type) opposite the first doping type.

The one or more photodetectors 202 are disposed in the first semiconductor substrate 107. In some embodiments, the one or more photodetectors 208 are also disposed in the first semiconductor substrate 107 (see, e.g., FIG. 2). In some embodiments, the one or more photodetectors 202 (and the one or more photodetectors 208) respectively comprise portions of the first semiconductor substrate 107 having the second doping type. In other embodiments, the one or more photodetectors 202 (and the one or more photodetectors 208) respectively comprise portions of the first semiconductor substrate 107 having the first doping type. In some embodiments, portions of the first semiconductor substrate 107 adjoining the one or more photodetectors 202 (and the one or more photodetectors 208) have the first doping type, or may be intrinsic.

The floating diffusion node 206 (and the floating diffusion node 212) are disposed in the first semiconductor substrate 107. In some embodiments, the floating diffusion node 206 (and the floating diffusion node 212) is a region of the first semiconductor substrate 107 having the second doping type. In some embodiments, the one or more transfer gates 204 (and the one or more transfer gates 210) are disposed along the front side 107f of the first semiconductor substrate 107.

Each of the one or more transfer gates 204 (and each of the one or more transfer gates 210) comprise a gate dielectric structure 302 and a gate electrode structure 304. In some embodiments, the gate electrode structure 304 is or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing. In further embodiments, the gate dielectric structure 302 is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, sidewall spacers 306 are disposed along the front side 107f of the first semiconductor substrate 107 and laterally surround the one or more transfer gates 204 (and the one or more transfer gates 210). In some embodiments, the sidewall spacers 306 may be or comprise, for example, an oxide (e.g., $SiO_2$), a nitride (e.g., silicon nitride (SiN)), an oxy-nitride (e.g., silicon oxynitride ($SiO_xN_y$)), some other dielectric, or a combination of the foregoing (e.g., oxide-nitride-oxide (ONO) sidewall spacer).

The first chip 102 comprises a first interlayer dielectric (ILD) structure 308. The first ILD structure 308 is disposed vertically between the first semiconductor substrate 107 and the second chip 104. In some embodiments, the first ILD structure 308 comprises one or more stacked ILD layers, which may respectively comprise a low-k dielectric (e.g., a dielectric material with a dielectric constant less than about 3.9), an oxide (e.g., $SiO_2$), or the like.

A first interconnect structure 310 (e.g., copper interconnect) is disposed in the first ILD structure 308. The first interconnect structure 310 is disposed vertically between the first semiconductor substrate 107 and the second chip 104. The first interconnect structure 310 comprises a first plurality of conductive contacts 310a (e.g., metal contacts), a first plurality of conductive wires 310b (e.g., metal wires), a first plurality of conductive vias 310c (e.g., metal vias), and a second plurality of conductive bond structures 310d (e.g., metal bond pads). In some embodiments, the first interconnect structure 310 may be or comprise, for example, copper (Cu), aluminum (Al), tungsten (W), gold (Au), some other conductive material, or a combination of the foregoing.

Also shown in the cross-sectional view 300 of FIG. 3, the second semiconductor substrate 117 has a front side 117f and a back side 117b opposite the front side 117f. In some embodiments, the front side 117f of the second semiconductor substrate 117 is defined by a first surface (e.g., a front side surface) of the second semiconductor substrate 117, and the back side 117b of the second semiconductor substrate 117 is defined by a second surface (e.g., a back side surface) of the second semiconductor substrate 117 that is opposite the first surface of the second semiconductor substrate 117. In some embodiments, the front side 107f of the first semiconductor substrate 107 is disposed vertically between the back side 107b of the first semiconductor substrate 107 and the second semiconductor substrate 117.

The second semiconductor substrate 117 may have the first doping type, or may be intrinsic. In other embodiments, the second semiconductor substrate 117 may have the second doping type. In some embodiments, the second semiconductor substrate 117 may have a same doping type as the first semiconductor substrate 107. In other embodiments, the second semiconductor substrate 117 may have an opposite doping type as the first semiconductor substrate 107.

The first plurality of transistors 214 (and the second plurality of transistors 222) are disposed along the front side 117f of the second semiconductor substrate 117. The source/drain regions 218 (and the source/drain regions 226) are disposed in the second semiconductor substrate 117. In some embodiments, the source/drain regions 218 (and the source/drain regions 226) respectively comprise portions of the second semiconductor substrate 117 having the second doping type. In other embodiments, the source/drain regions 218 (and the source/drain regions 226) respectively comprise portions of the first semiconductor substrate 107 having the first doping type. In some embodiments, portions of the second semiconductor substrate 117 adjoining the source/drain regions 218 (and the source/drain regions 226) have the first doping type (e.g., p-type/n-type), or may be intrinsic. The first isolation structure 220 (and the second isolation structure 228) are disposed in the second semiconductor substrate 117.

In some embodiments, each of the first plurality of transistors 214 (and each of the second plurality of transistors 222) comprise the gate electrode structure 216 overlying a gate dielectric structure 312. In some embodiments, the gate dielectric structure 312 is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In further embodiments, sidewall spacers 314 are disposed along the front side 117f of the second semiconductor substrate 117 and laterally surround the first plurality of transistors 214 (and the second plurality of transistors 222). In some embodiments, the sidewall spacers 314 may be or comprise, for example, an oxide (e.g., $SiO_2$), a nitride (e.g., SiN), an oxy-nitride (e.g., $SiO_XN_Y$), some other dielectric, or a combination of the foregoing (e.g., oxide-nitride-oxide (ONO) sidewall spacer).

The second chip 104 comprises a second ILD structure 316. The second ILD structure 316 is disposed vertically between the first ILD structure 308 and the second semiconductor substrate 117. In some embodiments, the second ILD structure 316 comprises one or more stacked ILD layers, which may respectively comprise a low-k dielectric (e.g., a dielectric material with a dielectric constant less than about 3.9), an oxide (e.g., $SiO_2$), or the like.

A second interconnect structure 318 (e.g., copper interconnect) is disposed in the second ILD structure 316. The second interconnect structure 318 is disposed vertically between the second semiconductor substrate 117 and the first ILD structure 308. The second interconnect structure 318 comprises a second plurality of conductive contacts 318a (e.g., metal contacts), a second plurality of conductive wires 318b (e.g., metal wires), a second plurality of conductive vias 318c (e.g., metal vias), and a third plurality of conductive bond structures 318d (e.g., metal bond pads). In some embodiments, the second interconnect structure 318 may be or comprise, for example, copper (Cu), aluminum (Al), tungsten (W), gold (Au), some other conductive material, or a combination of the foregoing.

The second chip 104 is bonded to the first chip 102. In some embodiments, the first ILD structure 308 is bonded to the second ILD structure 316. In further embodiments, dielectric-to-dielectric bonds exist at an interface of the first ILD structure 308 and the second ILD structure 316.

The second interconnect structure 318 is electrically coupled to the first interconnect structure 310. In some embodiments, the second interconnect structure 318 is electrically coupled to the first interconnect structure 310 via the second plurality of conductive bond structures 310d and the third plurality of conductive bond structures 318d. In some embodiments, the second plurality of conductive bond structures 310d are bonded to the third plurality of conductive bond structures 318d. In further embodiments, metal-to-metal bonds exist at interfaces in which the second plurality of conductive bond structures 310d engage the third plurality of conductive bond structures 318d.

The plurality of TSVs 136 are disposed in the second semiconductor substrate 117. The plurality of TSVs 136 extend vertically through the second semiconductor substrate 117 from the back side 117b to the front side 117f. In some embodiments, the plurality of TSVs 136 are disposed in the second semiconductor substrate 117 and the second ILD structure 316. In further embodiments, the plurality of TSVs 136 are electrically coupled to the second interconnect structure 318. In further embodiments, the plurality of TSVs 136 are electrically coupled to one or more of the second plurality of conductive wires 318b. In some embodiments, the plurality of TSVs 136 may be referred to as back-side through-substrate vias (BTSVs).

In some embodiments, the second chip 104 comprise a dielectric structure 320 disposed along the back side 117b of the second semiconductor substrate 117. In some embodiments, the dielectric structure 320 comprises one or more stacked dielectric layers, which may respectively comprise a low-k dielectric (e.g., a dielectric material with a dielectric constant less than about 3.9), an oxide (e.g., $SiO_2$), or the like.

A fourth plurality of conductive bond structures 323 are disposed in the dielectric structure 320. In some embodiments, a third plurality of conductive vias 322 (e.g., metal vias) are disposed in the dielectric structure 320. In some embodiments, the third plurality of conductive vias 322 may be or comprise, for example, copper (Cu), aluminum (Al), tungsten (W), gold (Au), some other conductive material, or a combination of the foregoing. In some embodiments, the fourth plurality of conductive bond structures 323 may be or comprise, for example, copper (Cu), aluminum (Al), tungsten (W), gold (Au), some other conductive material, or a combination of the foregoing.

In some embodiments, the third plurality of conductive vias 322 are electrically coupled to the plurality of TSVs 136, respectively. In further embodiments, the third plurality of conductive vias 322 are electrically coupled to the fourth plurality of conductive bond structures 323, respectively. In yet further embodiments, the third plurality of conductive vias 322 electrically coupled the plurality of TSVs 136 to the fourth plurality of conductive bond structures 323, respectively.

Also shown in the cross-sectional view 300 of FIG. 3, the third semiconductor substrate 140 has a front side 140f and a back side 140b opposite the front side 140f. In some embodiments, the front side 140f of the third semiconductor substrate 140 is defined by a first surface (e.g., a front side surface) of the third semiconductor substrate 140, and the back side 140b of the third semiconductor substrate 140 is defined by a second surface (e.g., a back side surface) of the third semiconductor substrate 140 that is opposite the first surface of the third semiconductor substrate 140. In some embodiments, the front side 140f of the third semiconductor substrate 140 is disposed vertically between the back side 140b of the third semiconductor substrate 140 and the second semiconductor substrate 117.

The third semiconductor substrate 140 may have the first doping type, or may be intrinsic. In other embodiments, the third semiconductor substrate 140 may have the second doping type. In some embodiments, the third semiconductor substrate 140 may have a same doping type as the second semiconductor substrate 117. In other embodiments, the third semiconductor substrate 140 may have an opposite doping type as the second semiconductor substrate 117.

The one or more readout devices 236 and the one or more readout devices 238 are disposed on the third semiconductor substrate 140. In some embodiments, the one or more readout devices 236 and the one or more readout devices 238 are disposed along the front side 140f of the third semiconductor substrate 140.

In some embodiments, the one or more readout devices 236 and the one or more readout devices 238 each comprise a gate dielectric structure 324 and a gate electrode structure 326. In some embodiments, the gate electrode structure 326 is or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing. In further embodiments, the gate dielectric structure 324 is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, sidewall spacers 328 are disposed along the front side 140f of the third semiconductor substrate 140 and laterally surround the gate electrode structures of the one or more readout devices 236 and the gate electrode structures of the one or more readout devices 238. In some embodiments, the sidewall spacers 328 may be or comprise, for example, an oxide (e.g., SiO$_2$), a nitride (e.g., SiN), an oxy-nitride (e.g., SiO$_x$N$_y$), some other dielectric, or a combination of the foregoing (e.g., oxide-nitride-oxide (ONO) sidewall spacer).

In some embodiments, a third isolation structure 330 is disposed in the third semiconductor substrate 140. The third isolation structure 330 may laterally surround the one or more readout devices 236 and the one or more readout devices 238. In some embodiments, the third isolation structure 330 may be, for example, a shallow trench isolation (STI) structure, a deep trench isolation (DTI) structure, or the like.

In some embodiments, a first plurality of doped wells 332 are disposed in the third semiconductor substrate 140. The first plurality of doped wells 332 are regions of the third semiconductor substrate 140 having the first doping type. In some embodiments, a second plurality of doped wells 334 are disposed in the third semiconductor substrate 140. The second plurality of doped wells 334 are regions of the third semiconductor substrate 140 having the second doping type.

The third chip 106 comprises a third ILD structure 336. The third ILD structure 336 is disposed vertically between the second semiconductor substrate 117 and the third semiconductor substrate 140. In some embodiments, the third ILD structure 336 is disposed vertically between the dielectric structure 320 and the third semiconductor substrate 140. In some embodiments, the third ILD structure 336 comprises one or more stacked ILD layers, which may respectively comprise a low-k dielectric (e.g., a dielectric material with a dielectric constant less than about 3.9), an oxide (e.g., SiO$_2$), or the like.

A third interconnect structure 338 (e.g., copper interconnect) is disposed in the third ILD structure 336. The third interconnect structure 338 is disposed vertically between the second semiconductor substrate 117 and the third semiconductor substrate 140. In some embodiments, the third interconnect structure 338 is disposed vertically between the dielectric structure 320 and the third semiconductor substrate 140. The third interconnect structure 338 comprises a third plurality of conductive contacts 338a (e.g., metal contacts), a third plurality of conductive wires 338b (e.g., metal wires), a fourth plurality of conductive vias 338c (e.g., metal vias), and the first plurality of conductive bond structures 143 (e.g., metal bond pads). In some embodiments, the third interconnect structure 338 may be or comprise, for example, copper (Cu), aluminum (Al), tungsten (W), gold (Au), some other conductive material, or a combination of the foregoing.

The third chip 106 is bonded to the second chip 104. In some embodiments, the dielectric structure 320 is bonded to the third ILD structure 336. In further embodiments, dielectric-to-dielectric bonds exist at an interface of the dielectric structure 320 and the third ILD structure 336.

The third interconnect structure 338 is electrically coupled to the second interconnect structure 318. In some embodiments, the third interconnect structure 338 is electrically coupled to the second interconnect structure 318 via the plurality of TSVs 136, the fourth plurality of conductive bond structures 323, and the third plurality of conductive vias 322. In some embodiments, the fourth plurality of conductive bond structures 323 are bonded to first plurality of conductive bond structures 143. In further embodiments, metal-to-metal bonds exist at interfaces in which the fourth plurality of conductive bond structures 323 engage the first plurality of conductive bond structures 143.

Figure 4:
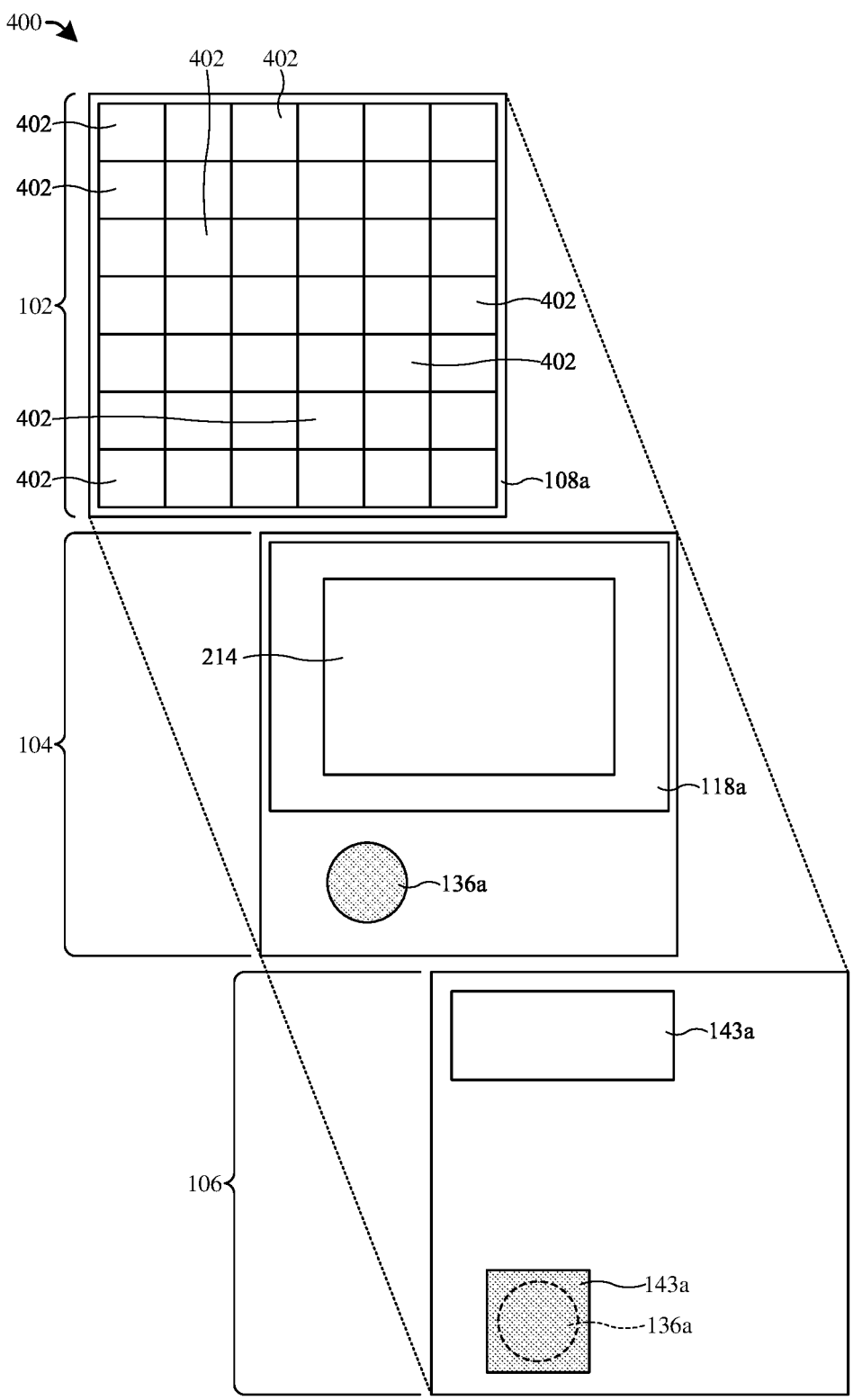
FIG. 4 illustrates a layout diagram of some embodiments of the high-speed readout image sensor.

FIG. 4 illustrates a layout diagram 400 of some embodiments of the high-speed readout image sensor.

As shown in the layout diagram 400 of FIG. 4, the first photodetector cell 108a may comprise a plurality of photodetector cell units 402. The plurality of photodetector cell units 402 each comprise a photodetector (see, e.g., one of the one or more photodetectors 202) and a transfer gate (see, e.g., one of the one or more transfer gates 204). In some embodiments, the plurality of photodetector cell units 402 are configured to transfer accumulated charges from their photodetectors (via their corresponding transfer gates) to a floating diffusion node (see, e.g., floating diffusion node 206). In some embodiments, the floating diffusion node of the first photodetector cell 108a is electrically coupled to (e.g., via the first interconnect structure 310 and the second interconnect structure 318) the first transistor cell 118a (and the first plurality of transistors 214). In further embodiments, the plurality of photodetector cell units 402 are disposed in an array comprising rows and columns.

It will be appreciated that each of the plurality of photodetector cells may comprise a corresponding plurality of photodetector cell units (see, e.g., the plurality of photodetector cell units 402). In some embodiments, each of the plurality of photodetector cells 108 comprise a same number of photodetector cell units (e.g., 1 photodetector cell unit, 2 photodetector cell units, 16 photodetector cell units, etc.). In some embodiments, the plurality of photodetector cells 108 comprise a same number of individual photodetector cells as the plurality of transistor cells 118 comprises individual transistor cells. In other words, there may be a one-to-one correspondence between the plurality of photodetector cells 108 and the plurality of transistor cells 118.

Figure 5:
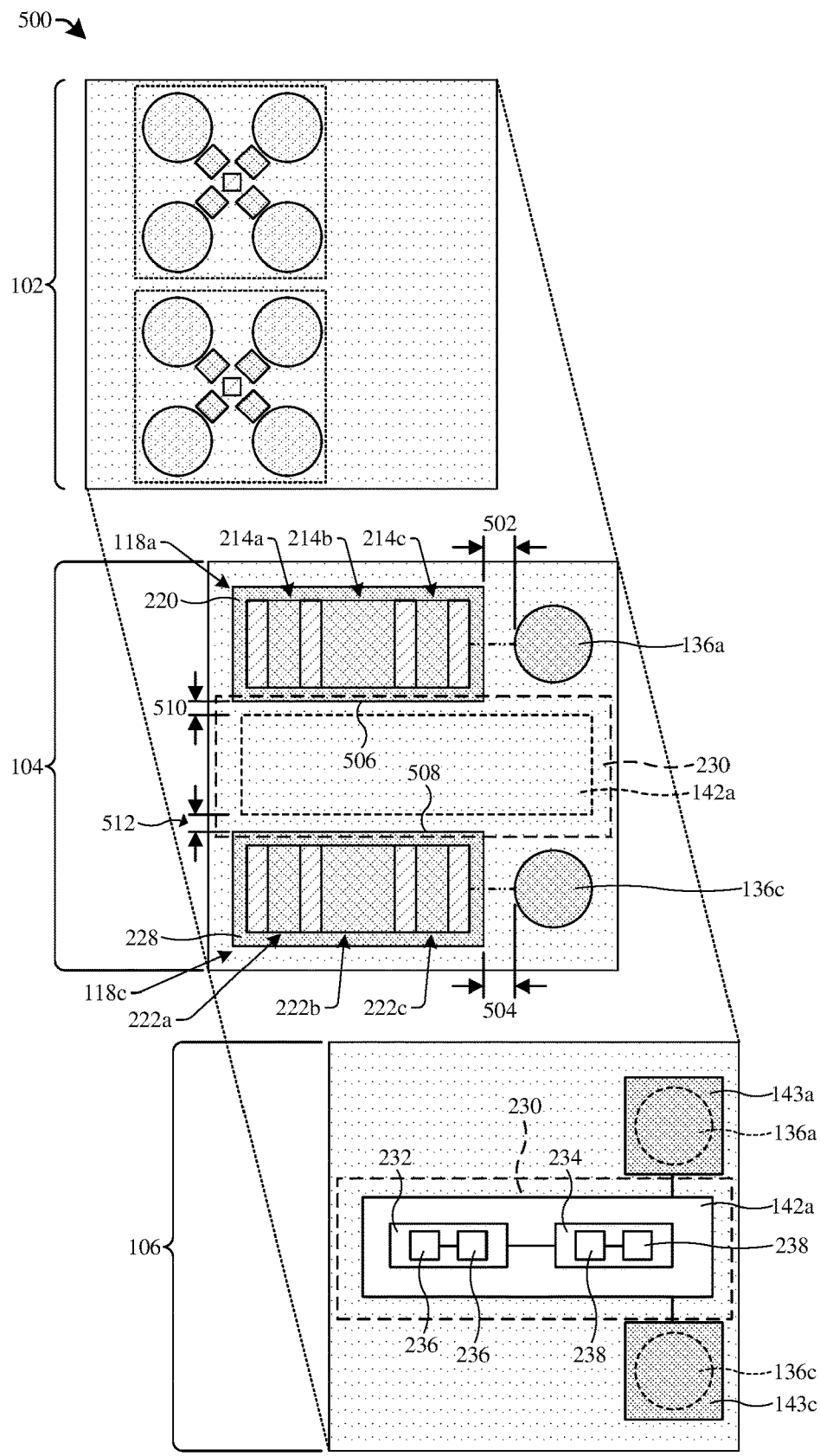
FIG. 5 illustrates a layout view of some other embodiments of the high-speed readout image sensor.

FIG. 5 illustrates a layout view 500 of some other embodiments of the high-speed readout image sensor. For clarity in the figures, the layout view 500 of FIG. 5 illustrates a perimeter of the first readout circuit 142a in phantom (illustrated via a dotted line) on the second chip 104.

As shown in the layout view 500 of FIG. 5, the first TSV 136a is laterally spaced from the first transistor cell 118a by a first distance 502. The first distance 502 is greater than or equal to 0.1 micrometers (μm). In some embodiments, if the first distance 502 is less than 0.1 μm, yield of the high-speed readout image sensor may be negatively affected due to a process for forming the plurality of TSVs 136 damaging the first transistor cell 118a (e.g., unintentionally etching portions of the first transistor cell 118a). The first TSV 136a may also be laterally spaced from the third transistor cell 118c by the first distance 502.

The third TSV 136c is laterally spaced from the third transistor cell 118c by a second distance 504. The second distance 504 is greater than or equal to 0.1 μm. In some embodiments, if the second distance 504 is less than 0.1 μm, yield of the high-speed readout image sensor may be negatively affected due to a process for forming the plurality of TSVs 136 damaging the third transistor cell 118c (e.g., unintentionally etching portions of the third transistor cell 118c). The third TSV 136c may also be laterally spaced from the first transistor cell 118a by the second distance 504.

In some embodiments, the first distance 502 may be substantially the same as the second distance 504 (e.g., substantially the same distance includes small variations due to fabrication steps). In other embodiments, the first distance 502 may be different than the second distance 504. In further embodiments, each of the plurality of TSVs 136 are laterally spaced from their corresponding transistor cell by at least 0.1 μm.

Also shown in the layout view 500 of FIG. 5, the first isolation structure 220 comprises a sidewall 506. The second isolation structure 228 comprises a sidewall 508. The sidewall 506 of the first isolation structure 220 faces the sidewall 508 of the second isolation structure 228. In some embodiments, the sidewall 506 of the first isolation structure 220 partially defines a perimeter of the first region 230 of the second chip 104. In further embodiments, the sidewall 508 of the second isolation structure 228 partially defines the perimeter of the first region 230 of the second chip 104. For example, the sidewall 506 of the first isolation structure 220 may define a first edge/side of the perimeter of the first region 230 of the second chip 104; and the sidewall 508 of the second isolation structure 228 may define a second edge/side of the perimeter of the first region 230 of the second chip 104.

The first readout circuit 142a is laterally spaced from the first transistor cell 118a by a third distance 510. The first readout circuit 142a is laterally spaced from the third transistor cell 118c by a fourth distance 512. In some embodiments, the third distance 510 is different than the fourth distance 512. In other embodiments, the third distance 510 is substantially the same as the fourth distance 512. In some embodiments, because the third distance 510 is substantially the same as the fourth distance 512, the conductive paths that electrically couple the transistor cells of the plurality of transistor cells 118 that are disposed in the first column 122a to the first readout circuit 142a may be further reduced. For example, in some embodiments, the first transistor cell 118a may be spaced further from the third transistor cell 118c than any other of the transistor cells of the plurality of transistor cells 118 that are disposed in the first column 122a. Thus, if the third distance 510 is substantially the same as the fourth distance 512, the first readout circuit 142a will be disposed along a centerline of the first array, thereby further reducing the conductive paths that electrically couple the transistor cells (of the first column 122a) to the first readout circuit 142a.

Figure 6:
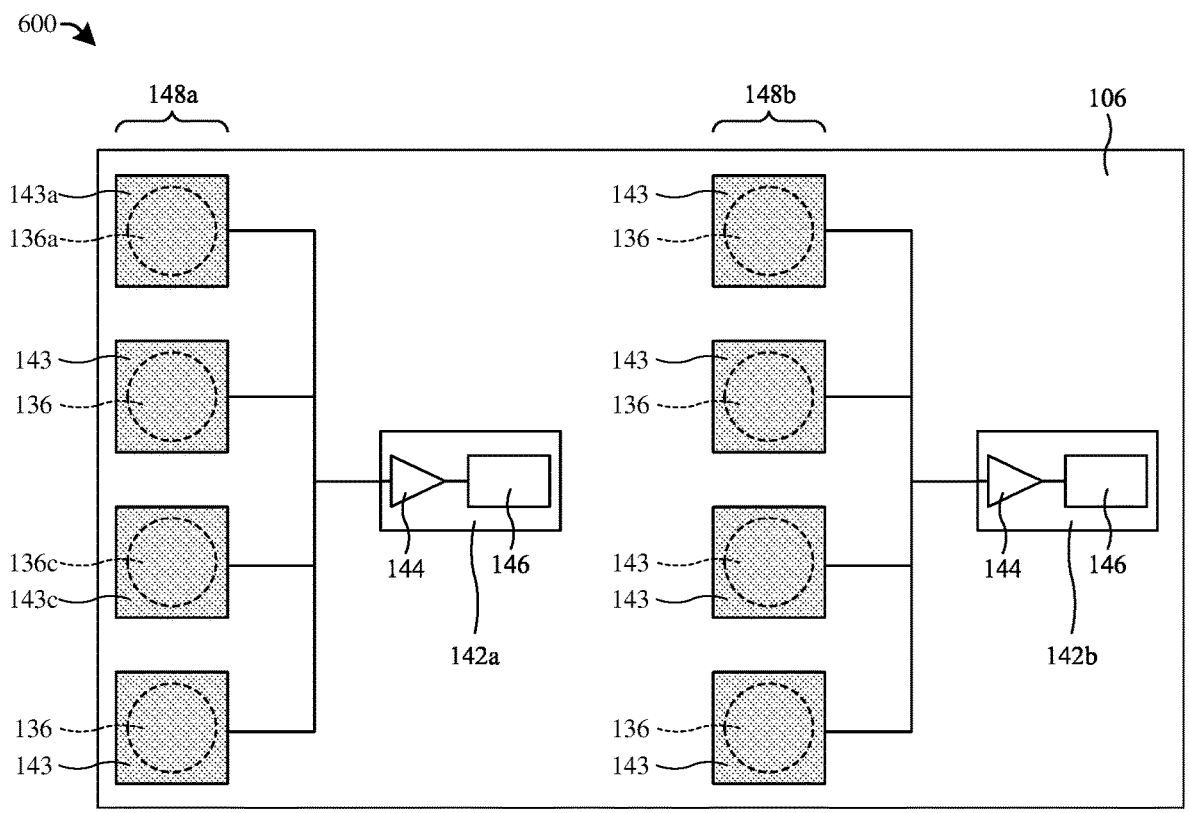
FIG. 6 illustrates a schematic diagram of some embodiments of a third chip of some embodiments of the high-speed readout image sensor.

FIG. 6 illustrates a schematic diagram 600 of some embodiments of a third chip 106 of some embodiments of the high-speed readout image sensor.

As shown in the schematic diagram 600 of FIG. 6, in some embodiments, each of the conductive bond structures of the first plurality of conductive bond structures 143 that are disposed in the first column 148a are electrically coupled to the first readout circuit 142a (illustrated via solid lines). In further embodiments, each of the conductive bond structures of the first plurality of conductive bond structures 143 that are disposed in the second column 148b are electrically coupled to the second readout circuit 142b (illustrated via solid lines). In further embodiments, each of the first plurality of readout circuits 142 may comprise an amplifier circuit 144 and an ADC 146. It will be appreciated that the third chip 106 may comprise additional circuits that are substantially the same as those illustrated in the schematic diagram 600 of FIG. 6 (e.g., other readout circuits that are electrically coupled to other conductive bond pads that are disposed in other columns). In some embodiments, if a high-speed readout image sensor comprises the circuits illustrated in the schematic diagram 600 of FIG. 6, the first plurality of readout circuits 142 may be referred to as column-level readout circuits (e.g., because the first plurality of readout circuits 142 are configured to receive (and read out) signals from a column of photodetector cells).

Figure 7:
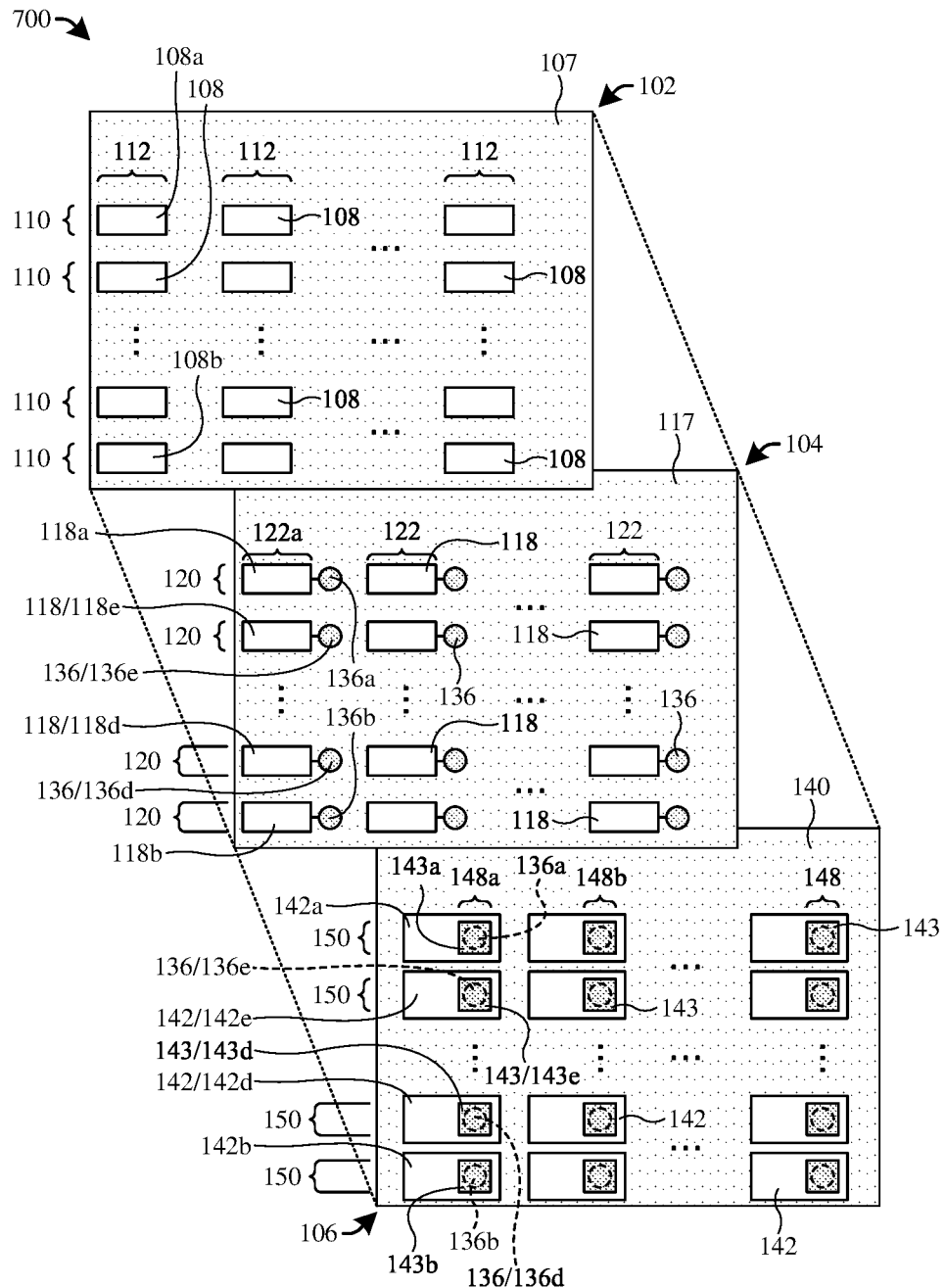
FIG. 7 illustrates a layout diagram of some other embodiments of the high-speed readout image sensor.

FIG. 7 illustrates a layout diagram 700 of some other embodiments of the high-speed readout image sensor.

As shown in the layout diagram 700 of FIG. 7, in some embodiments, the first plurality of conductive bond structures 143 are electrically coupled to the first plurality of readout circuits 142, respectively. For example, the first conductive bond structure 143a is electrically coupled to the first readout circuit 142a; the second conductive bond structure 143b is electrically coupled to the second readout circuit 142b; and so forth. It will be appreciated that the ellipsis symbols ( . . . ) shown in the layout diagram 700 of FIG. 7 illustrate that the first chip 102, the second chip 104, and/or the third chip 106 may be larger than illustrated and may comprise additional iterations of the features (e.g., additional TSVs, additional photodetectors cells, additional transistors cells, etc.) illustrated in the layout diagram 700 of FIG. 7.

Also shown in the layout diagram 700 of FIG. 7, a fourth conductive bond structure 143d of the first plurality of conductive bond structures 143 is electrically coupled to a fourth readout circuit 142d of the first plurality of readout circuits 142. The fourth conductive bond structure 143d is electrically coupled to a fourth TSV 136d of the plurality of TSVs 136. The fourth TSV 136d of the plurality of TSVs 136 is electrically coupled to a fourth transistor cell 118d of the plurality of transistor cells 118.

A fifth conductive bond structure 143e of the first plurality of conductive bond structures 143 is electrically coupled to a fifth readout circuit 142e of the first plurality of readout circuits 142. The fifth conductive bond structure 143e is electrically coupled to a fifth TSV 136e of the plurality of TSVs 136. The fifth TSV 136e of the plurality of TSVs 136 is electrically coupled to a fifth transistor cell 118e of the plurality of transistor cells 118. In some embodiments, each of the first transistor cell 118a, the second transistor cell 118b, the fourth transistor cell 118d, and the fifth transistor cell 118e are disposed in the first column 122a. In further embodiments, the fourth readout circuit 142d and the fifth readout circuit 142e are both disposed laterally between the first transistor cell 118a and the second transistor cell 118b.

Figure 8:
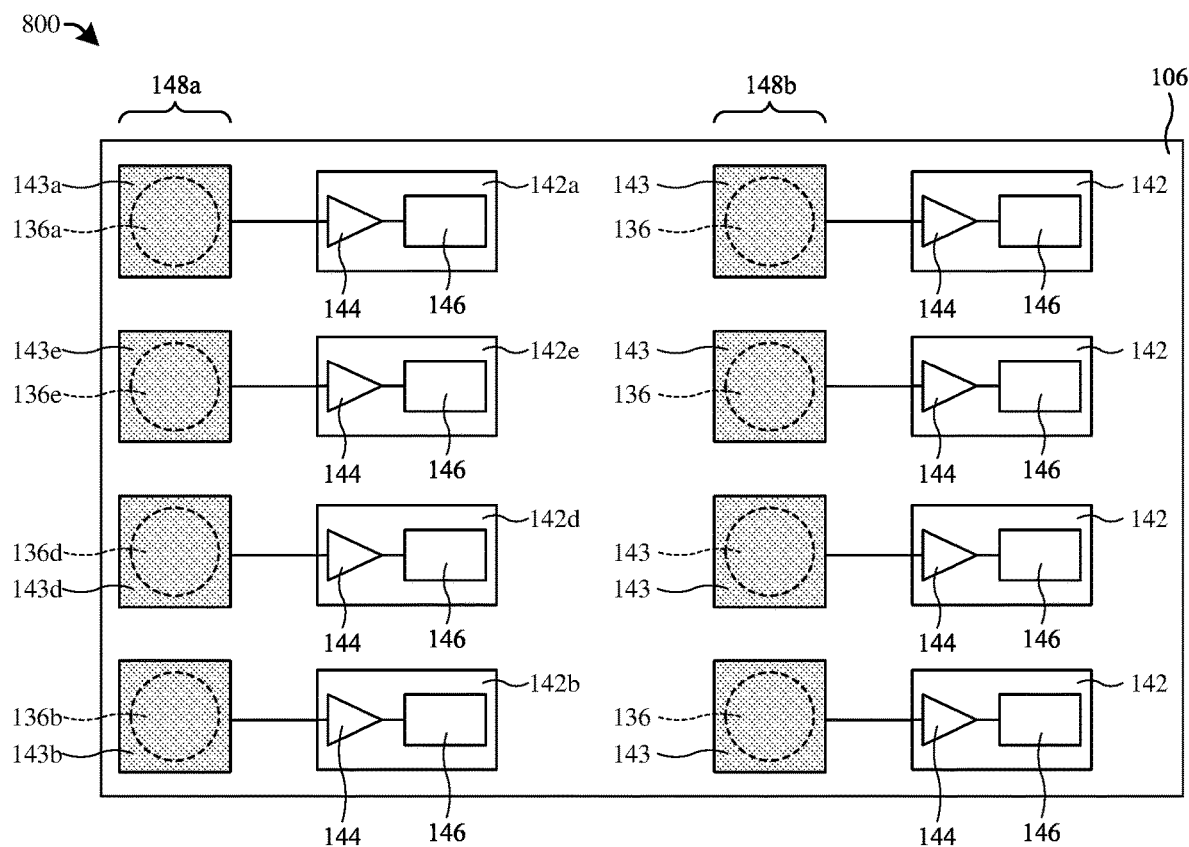
FIG. 8 illustrates a schematic diagram of some embodiments of a third chip of some embodiments of the high-speed readout image sensor of FIG. 7.

FIG. 8 illustrates a schematic diagram 800 of some embodiments of a third chip 106 of some embodiments of the high-speed readout image sensor of FIG. 7.

As shown in the schematic diagram 800 of FIG. 8, in some embodiments, the first plurality of conductive bond structures 143 are electrically coupled to the first plurality of readout circuits 142, respectively (illustrated via solid lines). In further embodiments, each of the first plurality of readout circuits 142 may comprise an amplifier circuit 144 and an ADC 146. It will be appreciated that the third chip 106 may comprise additional circuits that are substantially the same as those illustrated in the schematic diagram 800 of FIG. 8 (e.g., other readout circuits that are respectively electrically coupled to other conductive bond pads). In some embodiments, if a high-speed readout image sensor comprises the circuits illustrated in the schematic diagram 800 of FIG. 8, the first plurality of readout circuits 142 may be referred to as pixel-level readout circuits (e.g., because each of the first plurality of readout circuits 142 are configured to receive (and read out) signals from one of the plurality of photodetector cells 108). In some embodiments, because the first plurality of conductive bond structures 143 are respectively electrically coupled to the first plurality of readout circuits 142, the high-speed readout image sensor may have an even smaller RC delay (e.g., due to the first plurality of readout circuits 142 processing signals at a pixel level).

Figure 9:
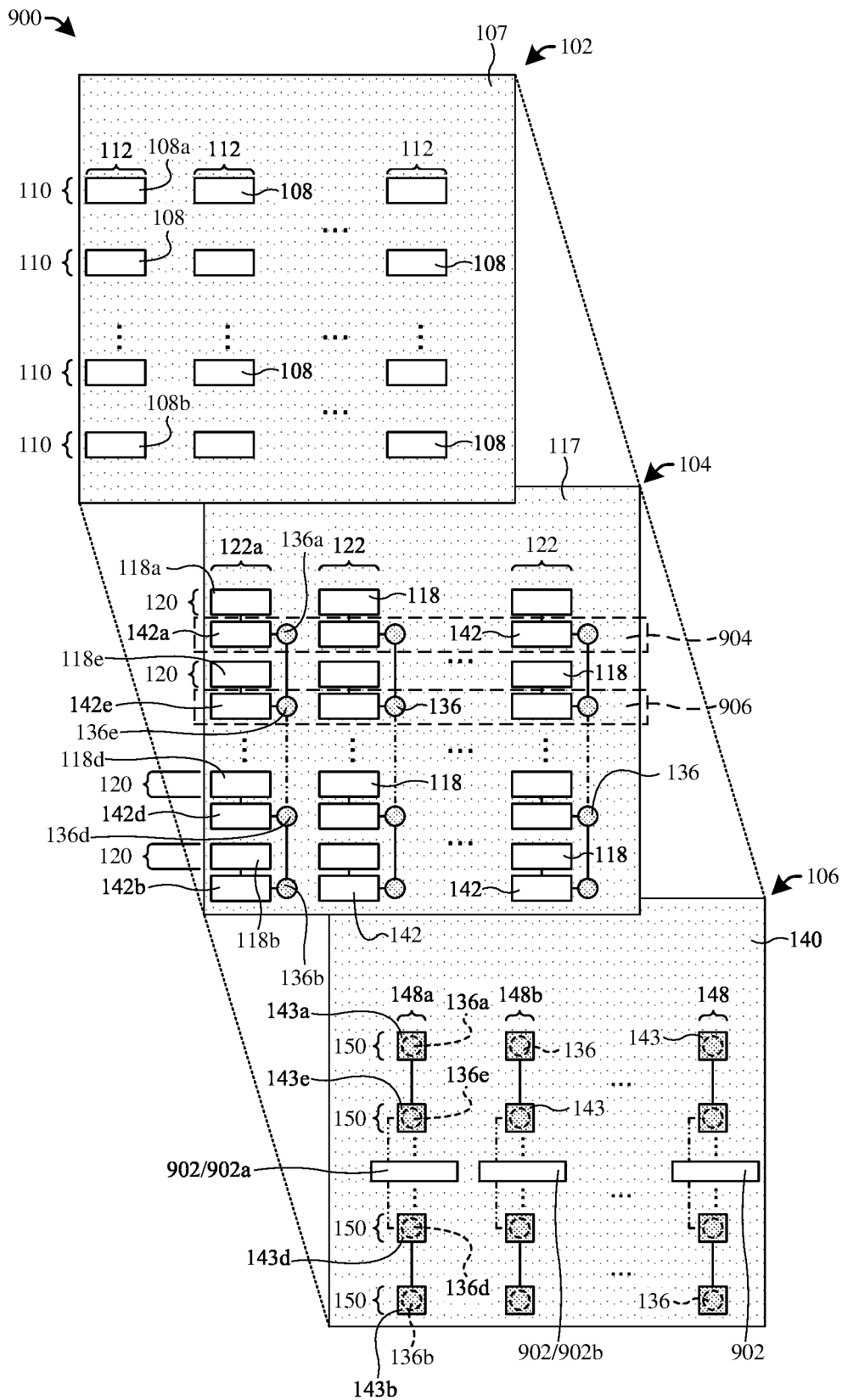
FIG. 9 illustrates a layout diagram of some other embodiments of the high-speed readout image sensor.

FIG. 9 illustrates a layout diagram 900 of some other embodiments of the high-speed readout image sensor.

As shown in the layout diagram 900 of FIG. 9, in some embodiments, the second chip 104 may comprise the first plurality of readout circuits 142. In some embodiments, the one or more readout devices (see, e.g., the one or more readout devices 236) are disposed on the second semiconductor substrate 117 (e.g., along the front side 117f of the second semiconductor substrate 117). The first plurality of readout circuits 142 are electrically coupled to the plurality of transistor cells 118, respectively. In some embodiments, the first plurality of readout circuits 142 are respectively electrically coupled to the plurality of transistor cells 118 via conductive features of the second interconnect structure 318 (e.g., the second plurality of conductive contacts 318a, the second plurality of conductive wires 318b, the second plurality of conductive vias 318c, etc.). In some embodiments, the second interconnect structure 318 may also electrically coupled together TSVs disposed in a column of TSVs (illustrated by solid lines).

Also shown in the layout diagram 900 of FIG. 9, in some embodiments, the third chip 106 comprises a second plurality of readout circuits 902. In some embodiments, each of the second plurality of readout circuits 902 comprise one or more image processing circuits (e.g., anti-aliasing circuit, smoothing circuit, low pass filter, high pass filter, compression circuitry, some other image processing circuit, or a combination of the foregoing). In further embodiments, each of the second plurality of readout circuits 902 comprise substantially the same features and/or have substantially the same layout.

The first plurality of conductive bond structures 143 are electrically coupled to the second plurality of readout circuits 902. More specifically, in some embodiments, the conductive bond structures of the first plurality of conductive bond structures 143 of a given column of the third plurality of columns 148 are electrically coupled to a corresponding one of the second plurality of readout circuits 902. For example, in some embodiments, each of the first plurality of conductive bond structures 143 that are disposed in the first column 148a are electrically coupled to a first readout circuit 902a of the second plurality of readout circuits 902; each of the first plurality of conductive bond structures 143 that are disposed in the second column 148b are electrically coupled to a second readout circuit 902b of the second plurality of readout circuits 902; and so forth. It will be appreciated that the ellipsis symbols ( . . . ) shown in the layout diagram 900 of FIG. 9 illustrate that the first chip 102, the second chip 104, and/or the third chip 106 may be larger than illustrated and may comprise additional iterations of the features (e.g., additional TSVs, additional photodetectors cells, additional transistors cells, additional readout circuits, etc.) illustrated in the layout diagram 900 of FIG. 9.

In some embodiments, the first plurality of readout circuits 142 are configured to receive first electrical signals from the plurality of transistor cells 118 and output second electrical signals, which are based on the first electrical signals, to the plurality of TSVs 136. For example, in some embodiments, the first readout circuit 142a is configured to receive a first electrical signal from the first transistor cell 118a and output a second electrical signal, which is based on the first electrical signal, to the first TSV 136a; the second readout circuit 142b is configured to receive a third electrical signal from the second transistor cell 118b and output a fourth electrical signal, which is based on the third electrical signal, to the second TSV 136b; and so forth. In further embodiments, the first electrical signals correspond to a number of charges accumulated in the one or more photodetectors of the plurality of photodetector cells 108.

In some embodiments, a readout circuit of the first plurality of readout circuits 142 corresponds to a readout circuit of the second plurality of readout circuits 902 if such readout circuit of the first plurality of readout circuits 142 is electrically coupled to such readout circuit of the second plurality of readout circuits 902 via one of the first plurality of conductive bond structures 143. For example, in some embodiments, each of the conductive bond structures of the first plurality of conductive bond structures 143 that are disposed in the first column 148a are electrically coupled to the first readout circuit 902a; and thus each of the first plurality of readout circuits 142 that are electrically coupled to the conductive bond structures of the first plurality of conductive bond structures 143 that are disposed in the first column 148a correspond to the first readout circuit 902a. In further embodiments, the second plurality of readout circuits 902 are configured to receive the second electrical signals from their corresponding readout circuits of the first plurality of readout circuits 142 and output third electrical signals (e.g., image processed signals). For example, in some embodiments, the first readout circuit 902a is configured to receive the second electrical signal from the first readout circuit 142a and output a fifth electrical signal that is based on the second electrical signal; the first readout circuit 902a is configured to receive the fourth electrical signal from the second readout circuit 142b and output a sixth electrical signal that is based on the fourth electrical signal; and so forth.

Also shown in the layout diagram 900 of FIG. 9, a second region 904 of the second chip 104 is disposed laterally between the first transistor cell 118a and the fifth transistor cell 118e. It will also be appreciated that, in some embodiments, the second region 904 of the second chip 104 may be substantially the same (e.g., comprise similar structural features (and/or have a substantially similar layout)) as the first region 230 of the second chip 104. In some embodiments, the first readout circuit 142a is disposed within a perimeter of the second region 904 of the second chip 104. In further embodiments, the first TSV 136a may be disposed in the perimeter of the second region 904 of the second chip 104.

A third region 906 of the second chip 104 is disposed laterally between the fifth transistor cell 118e and the fourth transistor cell 118d. In some embodiments, the third region 906 of the second chip 104 is also disposed laterally between the first TSV 136a and the fourth TSV 136d. It will also be appreciated that, in some embodiments, the third region 906 of the second chip 104 may be substantially the same (e.g., comprise similar structural features (and/or have a substantially similar layout)) as the first region 230 of the second chip 104. In some embodiments, the fifth readout circuit 142e is disposed within a perimeter of the third region 906 of the second chip 104. In further embodiments, the fifth TSV 136e may be disposed in the perimeter of the third region 906 of the second chip 104. In some embodiments, because the second chip comprises the first plurality of readout circuits 142, the third chip 106 may comprise additional image processing circuits (see, e.g., the second plurality of readout circuits 902), thereby increasing the applications in which the high-speed readout image sensor may be employed.

In some embodiments (not shown), the first plurality of readout circuits 142 may respectively have a part that is disposed within the second chip 104 and a part that is disposed in the third chip 106. For example, a first readout circuit of the first plurality of readout circuits 142 may have a part in the second chip 104 and a part in the third chip 106, a second readout circuit of the first plurality of readout circuits 142 may have a part in the second chip 104 and a part in the third chip 106, etc. By having the first plurality of readout circuits 142 split between the second chip 104 and the third chip 106, an area of the third chip 106 consumed by the first plurality of readout circuits 142 can be reduced thereby allowing for more area for image signal processing functionality within the third chip. In some embodiments, the third chip 106 may be formed at a smaller processing node than the second chip 104, such that the integrated chip structure can on the whole be made to be more cost effective by splitting the first plurality of readout circuits 142 between the second chip 104 and the third chip 106. FIGS. 10A-10B through 14A-14B illustrate a series of various views of some embodiments of a method for forming a high-speed readout image sensor. Figures with a suffix of "A" (e.g., FIG. 10A) illustrate a series of cross-sectional views 1000a-1400a of some embodiments of a method for forming a high-speed readout image sensor. Figures with a suffix "B" (e.g., FIG. 10B) illustrate a series of layout views 1000b-1400b of corresponding figures of FIGS. 10A-14A (e.g., FIG. 10B illustrates a layout view of some embodiments of the structure illustrated in FIG. 10A).

Figure 10A:
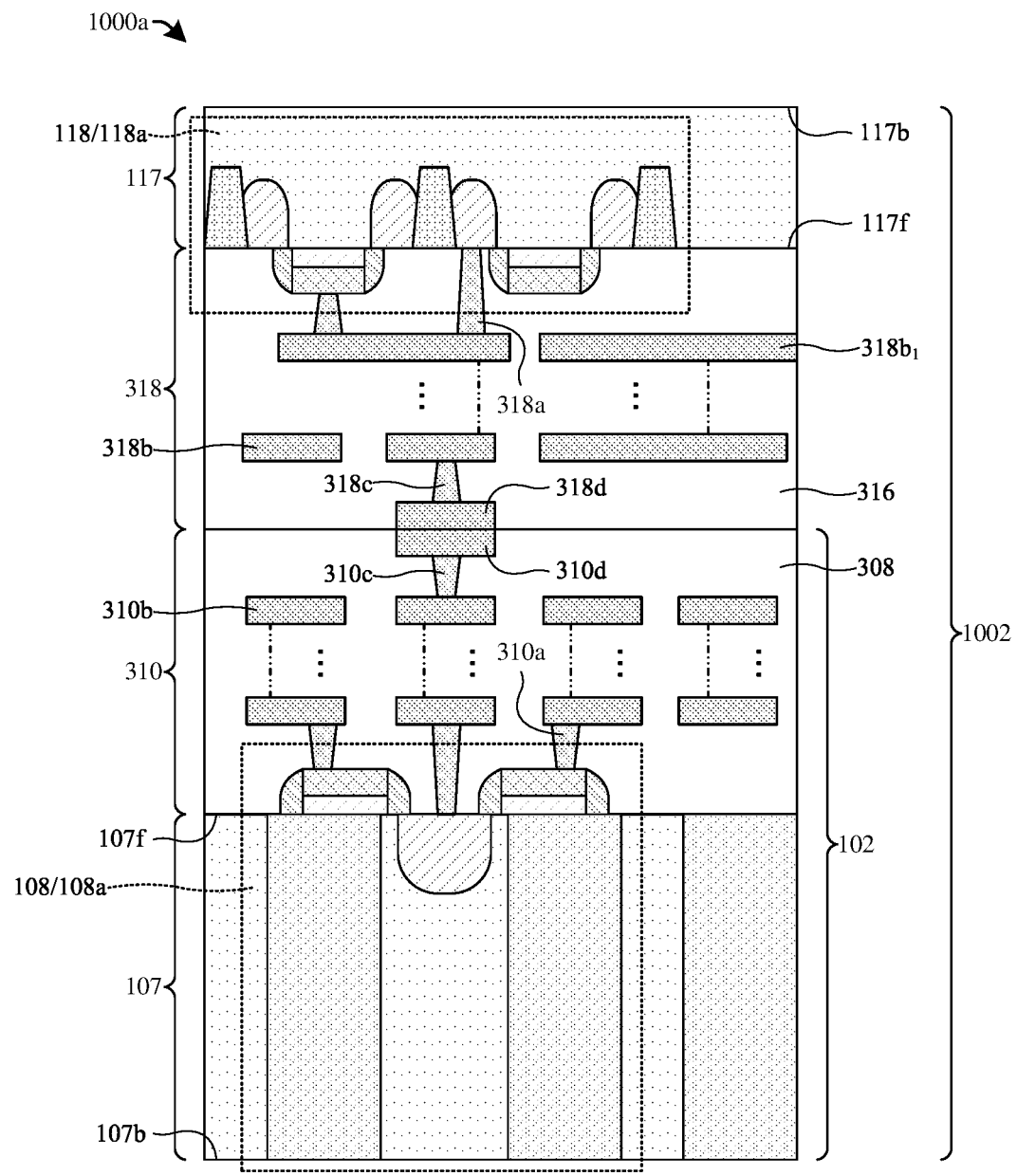
FIGS. 10A-10B through 14A-14B illustrate a series of various views of some embodiments of a method for forming a high-speed readout image sensor.
Figure 10B:
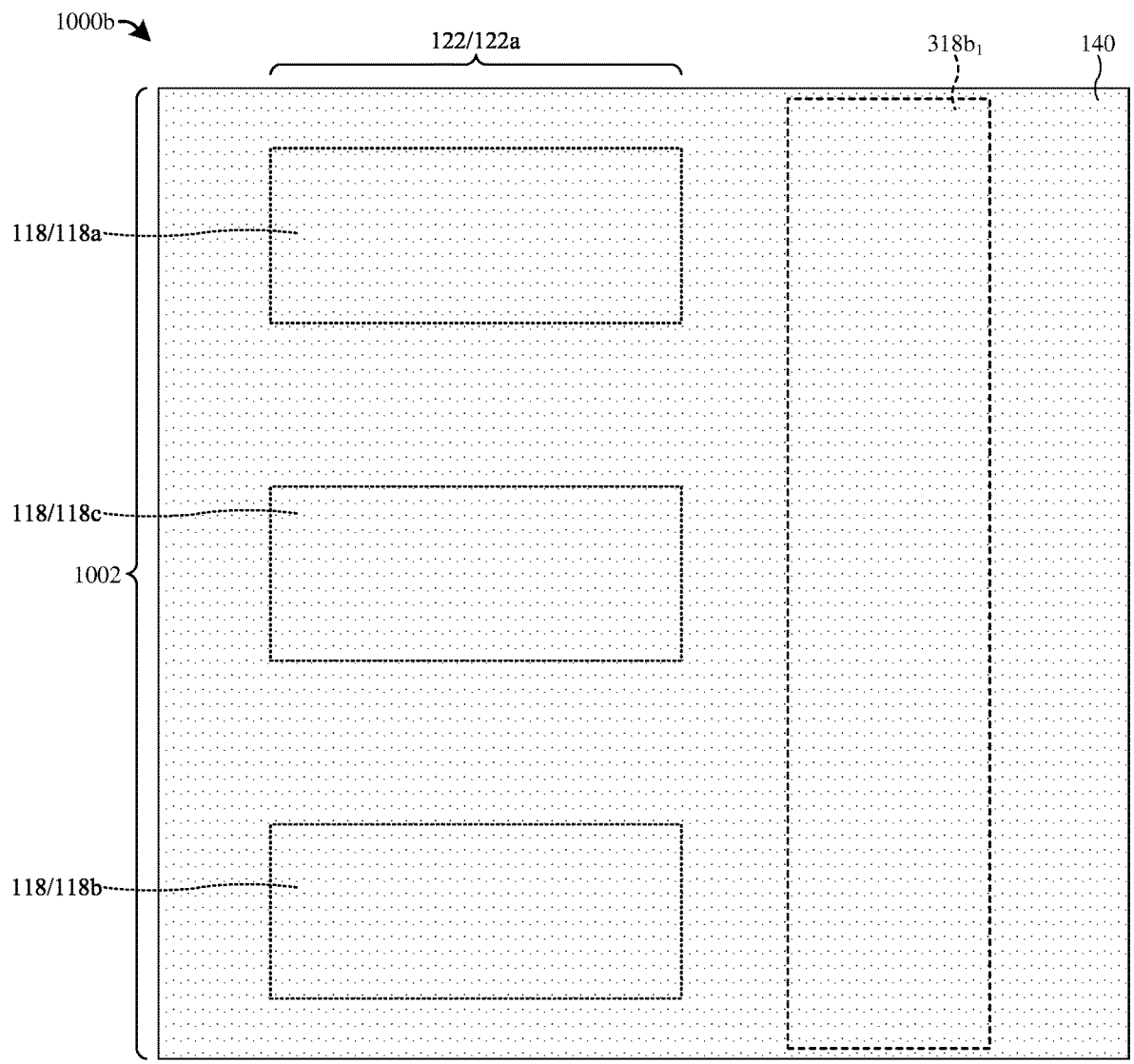

As shown in the various views 1000a-1000b of FIGS. 10A-10B, a workpiece 1002 is received. The workpiece 1002 comprises a second semiconductor substrate 117. The second semiconductor substrate 117 comprises a front side 117f and a back side 117b. A plurality of transistor cells 118 are disposed on the second semiconductor substrate 117. In some embodiments, the plurality of transistor cells 118 are laterally spaced.

A second ILD structure 316 is disposed along the front side 117f of the second semiconductor substrate 117. A second interconnect structure 318 is disposed in the second ILD structure 316. The second interconnect structure 318 comprises a second plurality of conductive contacts 318a (e.g., metal contacts), a second plurality of conductive wires 318b (e.g., metal wires), a second plurality of conductive vias 318c (e.g., metal vias), and a third plurality of conductive bond structures 318d (e.g., metal bond pads).

In some embodiments, the second plurality of conductive wires 318b comprises a first conductive wire 318$b_1$. In further embodiments, the first conductive wire 318$b_1$ is electrically coupled to the transistor cells of the plurality of transistor cells 118 of a given column of the second plurality of columns 122. For example, a first transistor cell 118a, a second transistor cell 118b, and a third transistor cell 118c are each disposed in a first column 122a of a second plurality of columns 122; and the first conductive wire 318$b_1$ is electrically coupled to each of the first transistor cell 118a, the second transistor cell 118b, and the third transistor cell 118c. In further embodiments, the first conductive wire 318$b_1$ is electrically coupled to a source/drain region of a third transistor (see, e.g., the third transistor 214c, the third transistor 222c, the third transistor 124c, etc.) of each of the transistor cells of the plurality of transistor cells 118 that are disposed in the first column 122a. In yet further embodiments, the first conductive wire 318$b_1$ may be disposed in a metal layer (e.g., metal 1) of the second interconnect structure 318 that is disposed nearer the second semiconductor substrate 117 than any other metal layer of the second interconnect structure 318.

In some embodiments, the workpiece 1002 also comprises a first chip 102. In other embodiments, the workpiece 1002 may not comprise the first chip 102 (e.g., the first chip 102 is bonded to the second chip 104 at a later stage in fabrication). The first chip 102 comprises a first semiconductor substrate 107. The first semiconductor substrate 107 has a front side 107f and a back side 107b. A plurality of photodetector cells 108 are disposed in/on the first semiconductor substrate 107.

A first ILD structure 308 is disposed along the front side 107f of the first semiconductor substrate 107. The first ILD structure 308 is disposed between the second ILD structure 316 and the front side 107f of the first semiconductor substrate 107. A first interconnect structure 310 is disposed in the first ILD structure 308. The first interconnect structure 310 comprises a first plurality of conductive contacts 310a (e.g., metal contacts), a first plurality of conductive wires 310b (e.g., metal wires), a first plurality of conductive vias 310c (e.g., metal vias), and a second plurality of conductive bond structures 310d (e.g., metal bond pads). In some embodiments, the workpiece 1002 is formed by known complementary metal-oxide-semiconductor (CMOS) processes. Further, it will be appreciated that the features (e.g., structural features) of the workpiece 1002 may be substantially the same and/or have substantially the same layout as corresponding features described above.

Figure 11A:
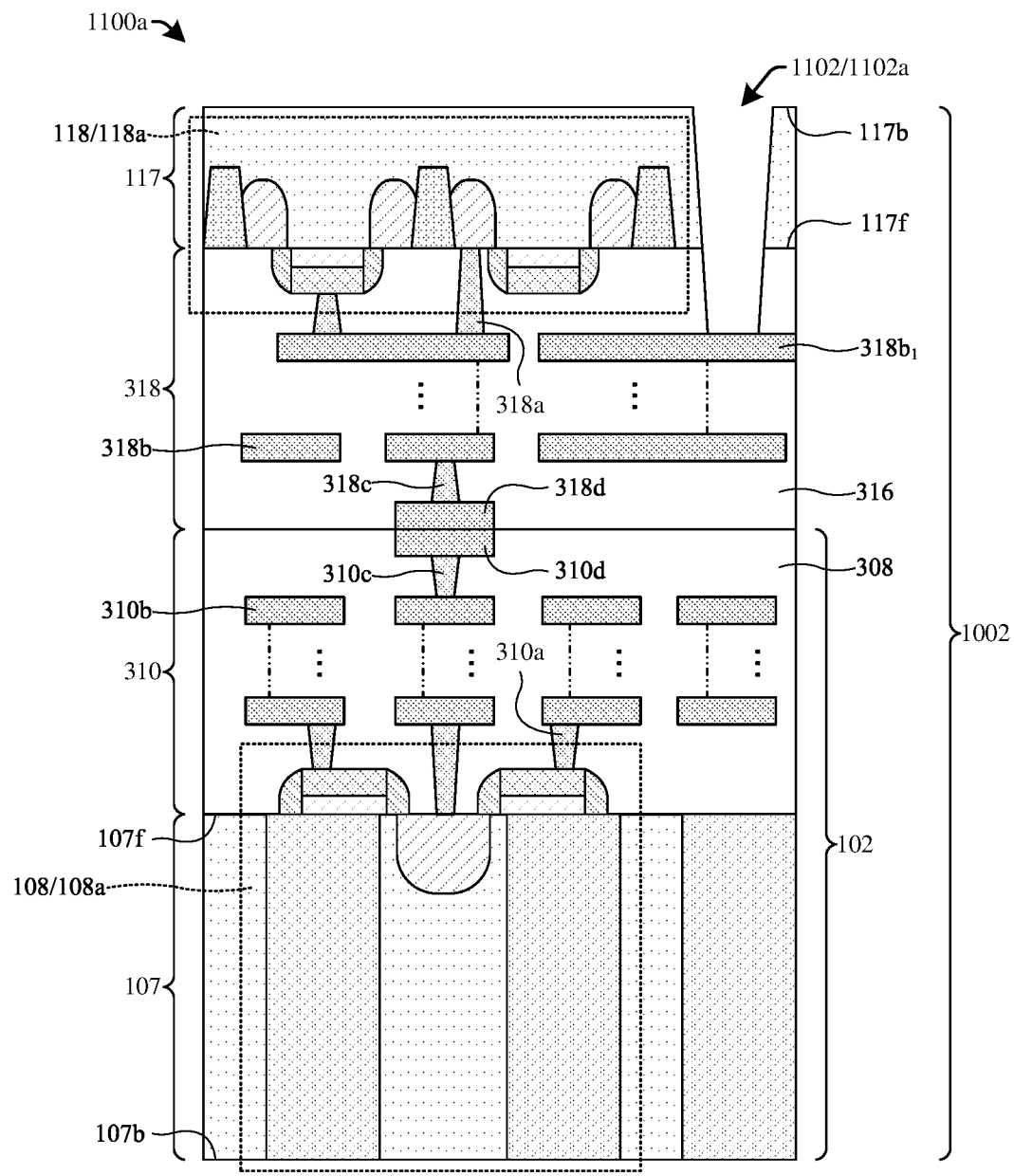
Figure 11B:
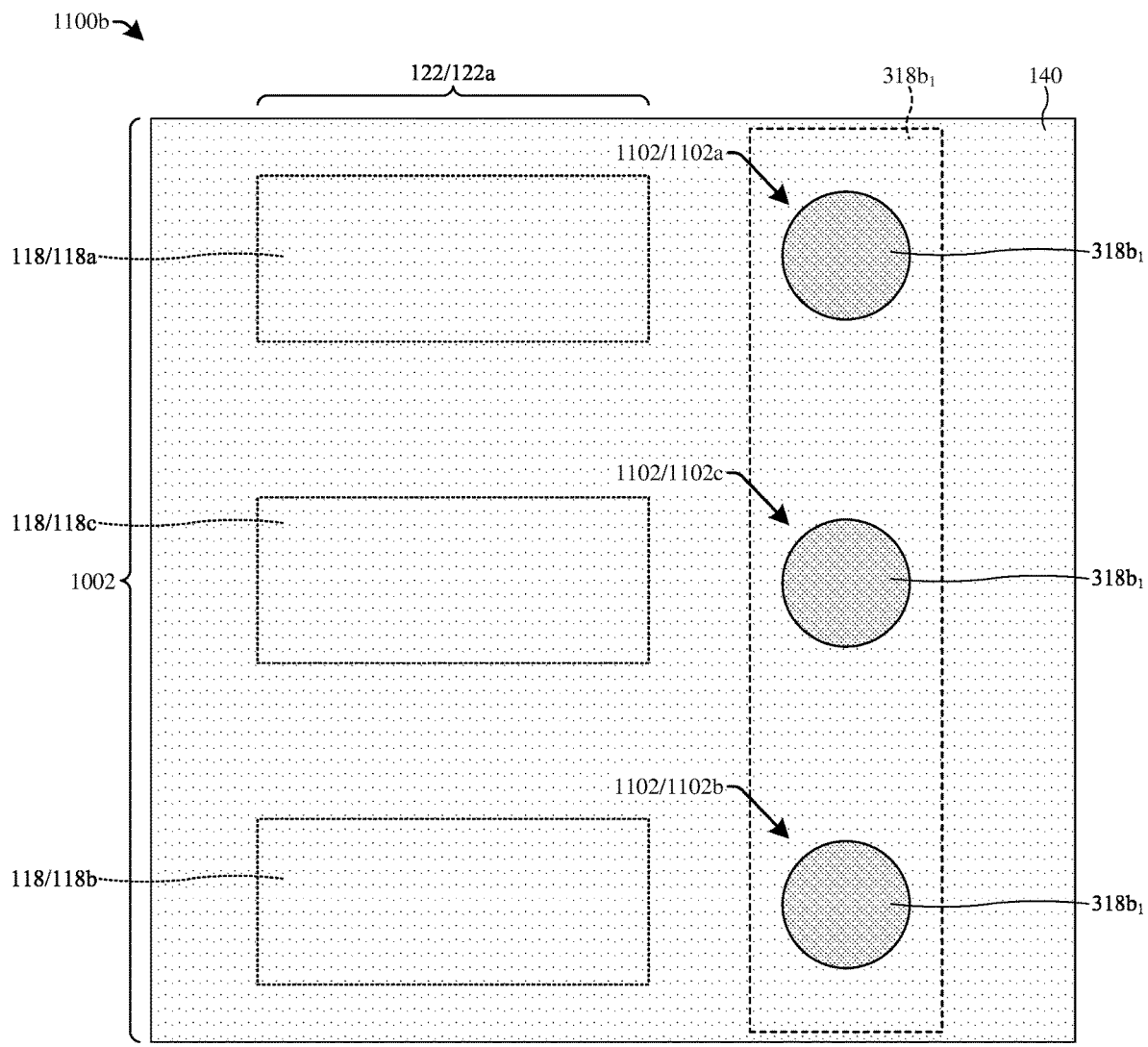

As shown in the various views 1100a-1100b of FIGS. 11A-11B, a plurality of through-substrate via (TSV) openings 1102 are formed in the second semiconductor substrate 117. In some embodiments, the plurality of TSV openings 1102 are also formed in the second ILD structure 316. The plurality of TSV openings 1102 are formed extending vertically through the second semiconductor substrate 117. In some embodiments, the plurality of TSV openings 1102 are formed extending vertically into the second ILD structure 316.

In some embodiments, the plurality of TSV openings 1102 respectively expose portions of the first conductive wire 318$b_1$. For example, the plurality of TSV openings 1102 comprises a first TSV opening 1102a, a second TSV opening 1102b, a third TSV opening 1102c, and so forth. The first TSV opening 1102a exposes a first portion of the first conductive wire 318$b_1$; the second TSV opening 1102b exposes a second portion of the first conductive wire 318$b_1$; the third TSV opening 1102c exposes a third portion of the first conductive wire 318$b_1$; and so forth. In some embodiments, the third TSV opening 1102c is formed laterally between the first transistor cell 118a and the second transistor cell 118b.

In some embodiments, a process for forming the plurality of TSV openings 1102 comprises forming a patterned masking layer (not shown) (e.g., positive/negative photoresist, a hardmask, etc.) along/over the back side 117b of the second semiconductor substrate 117. The patterned masking layer may be formed by forming a masking layer (not shown) on/over the back side 117b of the second semiconductor substrate 117 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the second semiconductor substrate 117 and the second ILD structure 316 to selectively etch the second semiconductor substrate 117 and the second ILD structure 316 according to the patterned masking layer. The etching process removes unmasked portions of the second semiconductor substrate 117 and unmasked portions of the second ILD structure 316, thereby forming the plurality of TSV openings 1102. In some embodiments, the etching process may be or comprise, for example, a wet etching process, a dry etching process, a reactive ion etching (RIE) process, some other etching process, or a combination of the foregoing. In further embodiments, the etching process stops on the first conductive wire $318b_1$ (e.g., the first conductive wire $318b_1$ acts as an etch stop layer during the etching process).

It will be appreciated that the various views 1100a-1100b of FIGS. 11A-11B only illustrate the formation of some of the TSV openings of the plurality of TSV openings 1102. Thus, it will also be appreciated that other TSV openings of the plurality of TSV openings 1102 may also be formed in the second semiconductor substrate 117 (and the second ILD structure 316). Moreover, it will be appreciated that the other TSV openings of the plurality of TSV openings 1102 may be formed so that they expose portions of other conductive wires of the second plurality of conductive wires 318b. For example, a first group of TSV openings (a portion of which is illustrated in the various views 1100a-1100b of FIGS. 11A-11B) are formed to expose portions of the first conductive wire $318b_1$; a second group of TSV openings (not shown) are formed to expose a second conductive wire (not shown) of the second plurality of conductive wires 318b; a third group of TSV openings (not shown) are formed to expose a third conductive wire (not shown) of the second plurality of conductive wires 318b; and so forth.

Figure 12A:
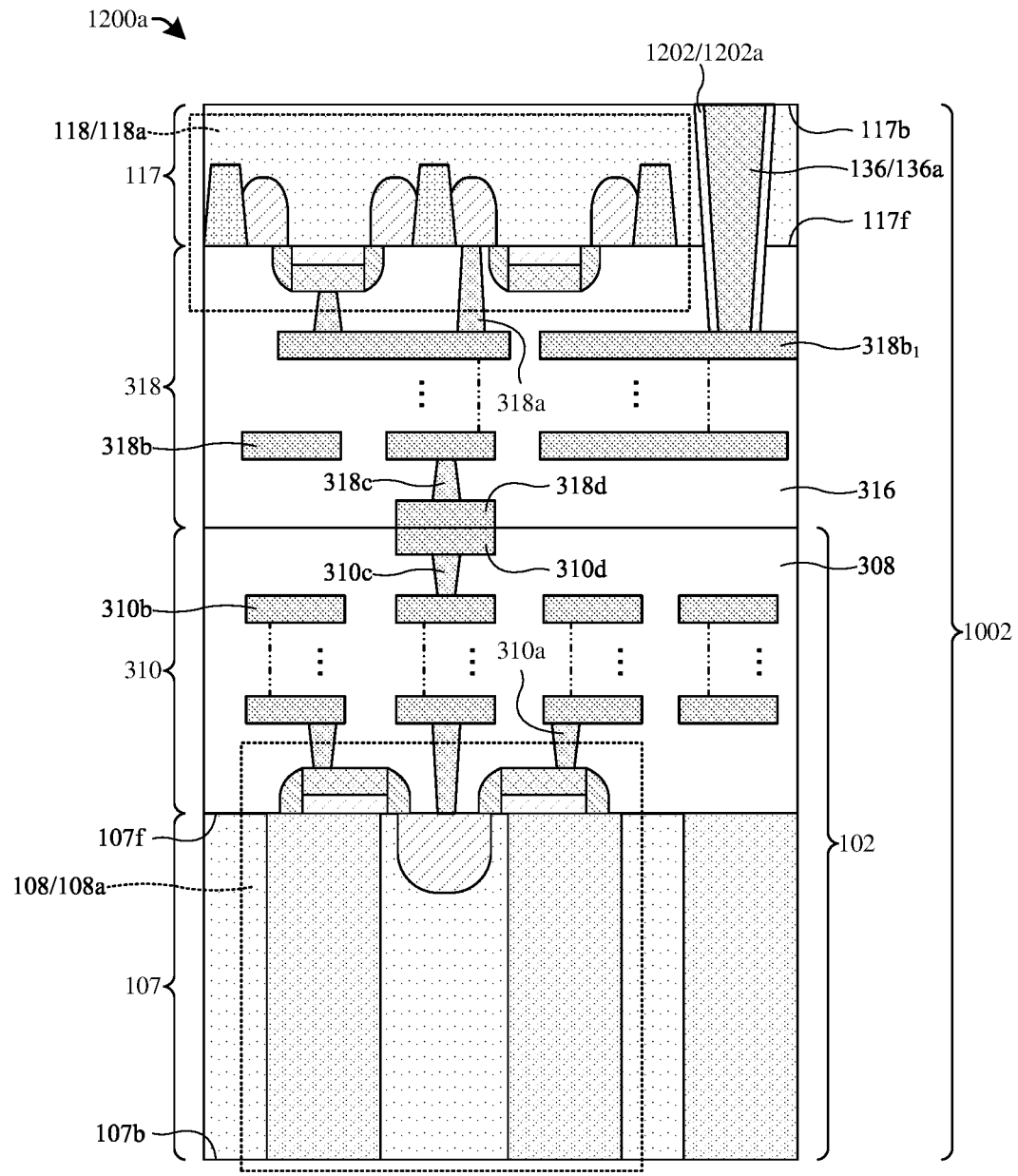
Figure 12B:
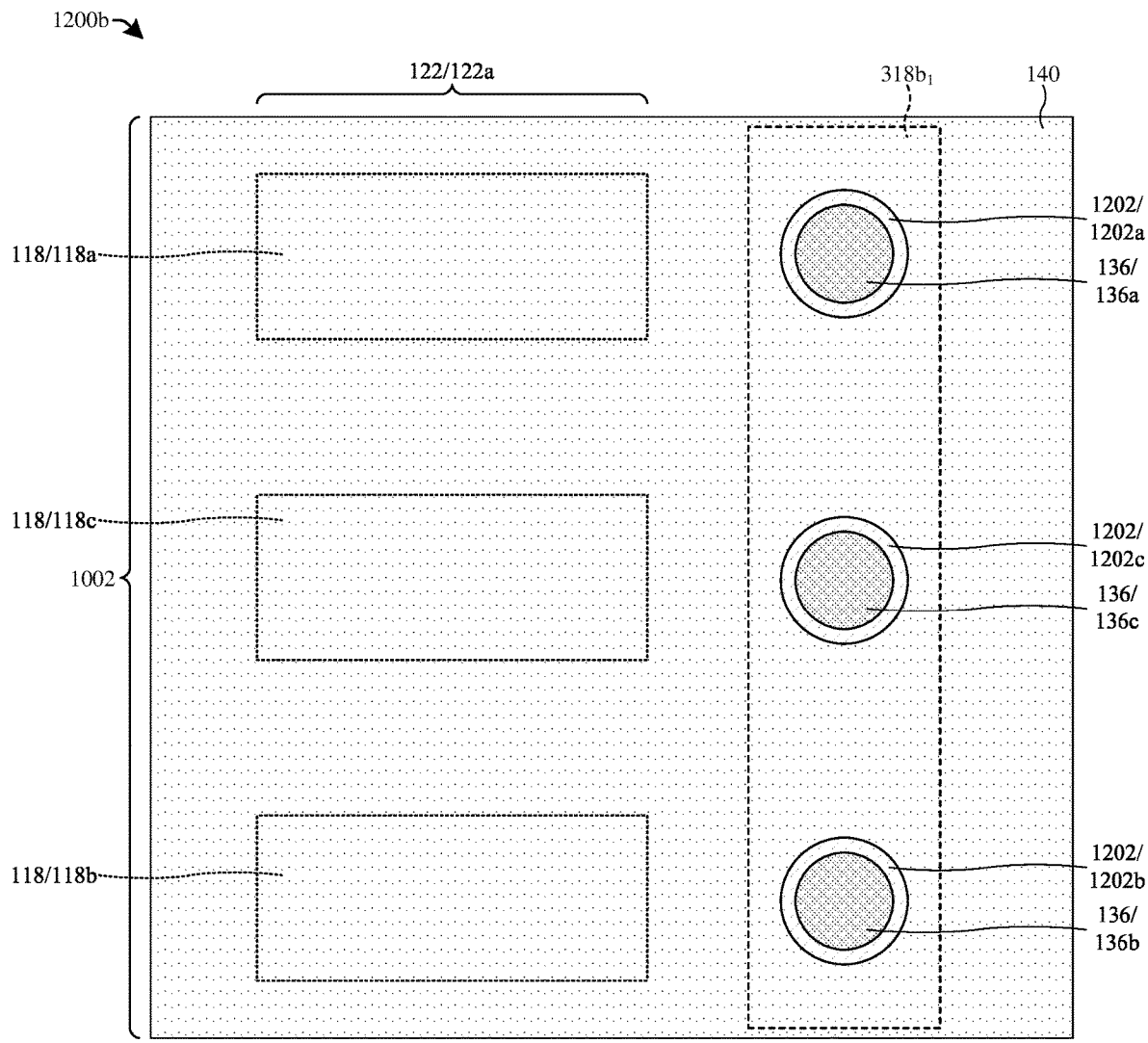

As shown in the various views 1200a-1200b of FIGS. 12A-12B, a plurality of TSVs 136 are respectively formed in the plurality of TSV openings 1102 (see, e.g., FIGS. 11A-11B). In some embodiments, the plurality of TSVs 136 are formed electrically coupled to a corresponding conductive wire of the second plurality of conductive wires 318b (e.g., a first group of TSVs are formed electrically coupled to the first conductive wire $318b_1$; a second group of TSVs are formed electrically coupled to the second conductive wire of the second plurality of conductive wires 318b; and so forth).

In some embodiments, the plurality of TSVs 136 comprises a first TSV 136a, a second TSV 136b, and a third TSV 136c. In further embodiments, the first TSV 136a is formed in the first TSV opening 1102a; the second TSV 136b is formed in the second TSV opening 1102b; and the third TSV 136c is formed in the third TSV opening 1102c. In yet further embodiments, each of the first TSV 136a, the second TSV 136b, and the third TSV 136c are formed electrically coupled to the first conductive wire $318b_1$.

Also shown in the various views 1200a-1200b of FIGS. 12A-12B, a plurality of dielectric liner structures 1202 may be respectively formed in the plurality of TSV openings 1102. In other embodiments, the plurality of dielectric liner structures 1202 may be omitted. The plurality of dielectric liner structures 1202 are formed along sidewalls of the plurality of TSV openings 1102, respectively. In some embodiments, the plurality of dielectric liner structures 1202 are formed along sidewalls of the second semiconductor substrate 117. In further embodiments, the plurality of dielectric liner structures 1202 may be formed along sidewalls of the second ILD structure 316. In some embodiments, the plurality of dielectric liner structures 1202 may be or comprise, for example, an oxide (e.g., SiO2), a nitride (e.g., SiN), an oxy-nitride (e.g., SiON), a carbide (e.g., silicon carbide (SiC)), some other dielectric material, or a combination of the foregoing. In some embodiments, a process for forming the plurality of dielectric liner structures 1202 comprises depositing or growing the dielectric liner structures 1202 along the sidewalls of the plurality of TSV openings 1102. The dielectric liner structures 1202 may be deposited or grown by, for example, chemical vapor deposition (CVD), physical vapor deposition (PVD), atomic layer deposition (ALD), thermal oxidation, some other deposition process, or a combination of the foregoing.

In some embodiments, a process for forming the plurality of TSVs 136 comprises depositing a conductive material in the plurality of TSV openings 1102, thereby forming the plurality of TSVs 136 in the plurality of TSV openings 1102. In some embodiments, the conductive material is or comprises, for example, copper (Cu), aluminum (Al), gold (Au), silver (Ag), platinum (Pt), polysilicon, some other conductive material, or a combination of the foregoing. The conductive material may be deposited by, for example, CVD, PVD, ALD, sputtering, electrochemical plating, electroless plating, some other deposition process, or a combination of the foregoing. In some embodiments, a planarization process (e.g., chemical-mechanical polishing (CMP)) is performed on the conductive material to planarize surfaces of the TSVs 136 with the back side 117b of the second semiconductor substrate 117.

Figure 13A:
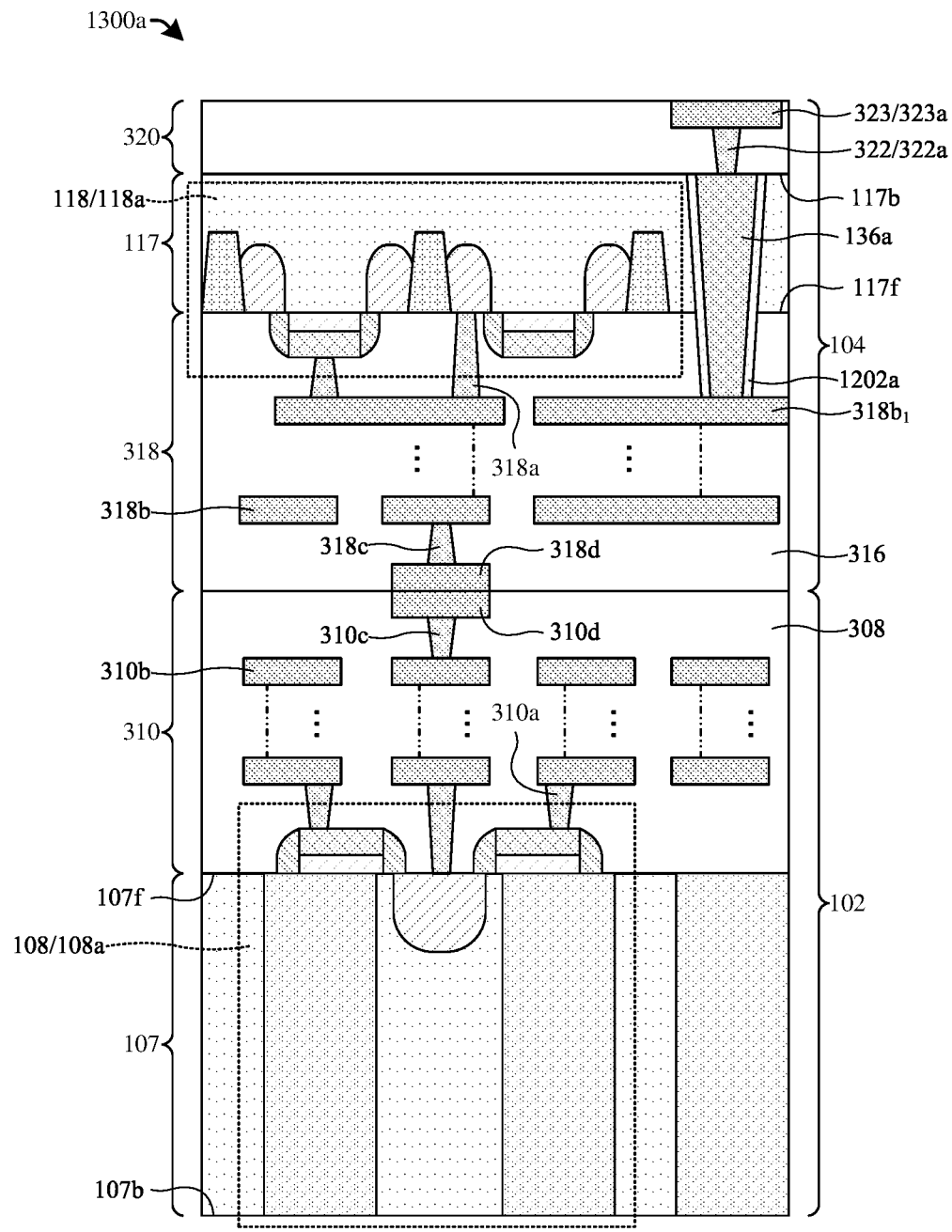
Figure 13B:
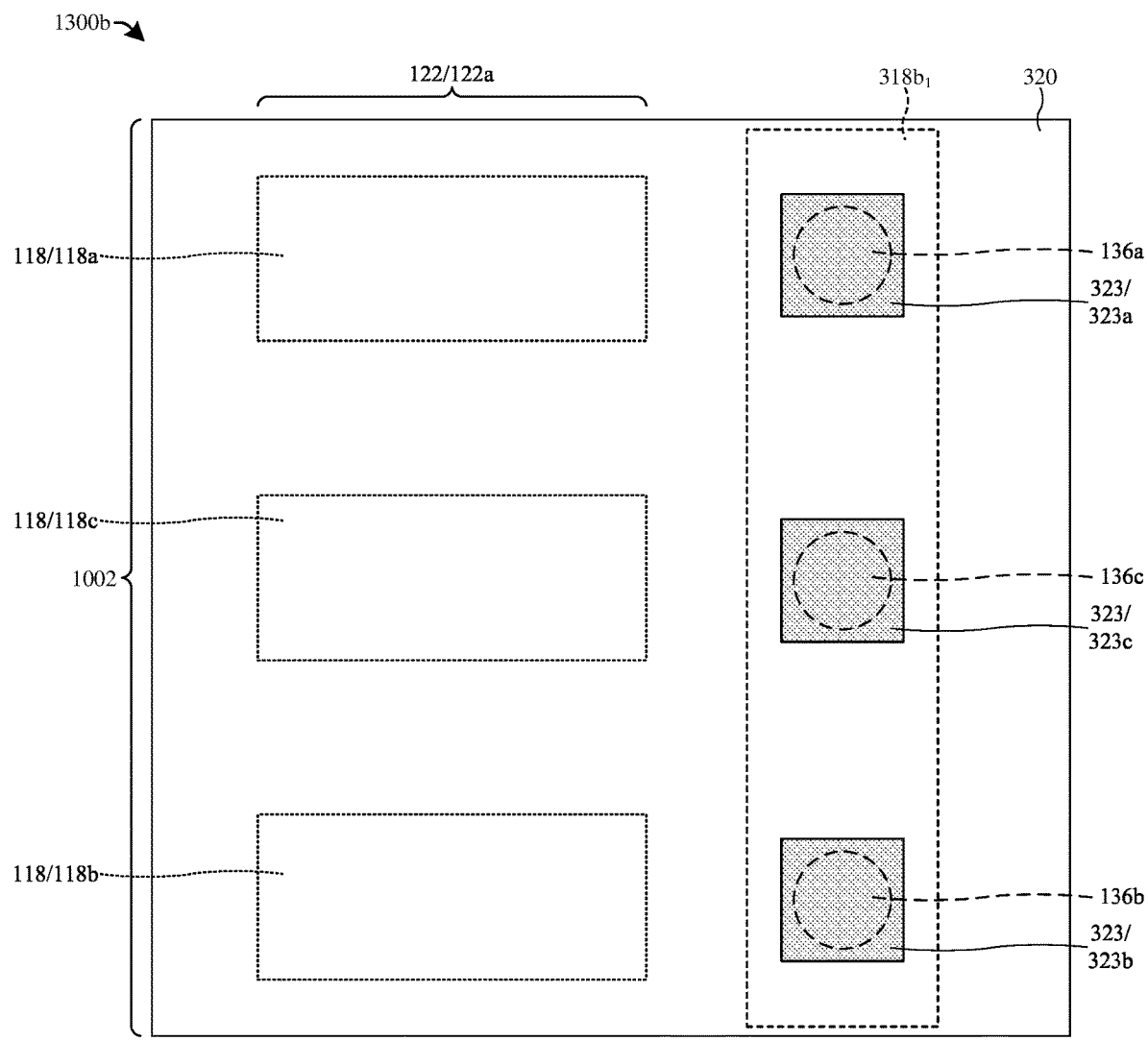

As shown in the various views 1300a-1300b of FIGS. 13A-13B, a dielectric structure 320 is formed along the back side 117b of the second semiconductor substrate 117. In some embodiments, the dielectric structure 320 is formed on the back side 117b of the second semiconductor substrate 117, on the plurality of TSVs 136, and/or on the plurality of dielectric liner structures 1202.

Also shown in the various views 1300a-1300b of FIGS. 13A-13B, a third plurality of conductive vias 322 are formed in the dielectric structure 320. The third plurality of conductive vias 322 are formed electrically coupled to the plurality of TSVs 136, respectively. For example, a first conductive via 322a of the third plurality of conductive vias 322 is formed electrically coupled to the first TSV 136a; a second conductive via (not shown) of the third plurality of conductive vias 322 is formed electrically coupled to the second TSV 136b; a third conductive via (not shown) of the third plurality of conductive vias 322 is formed electrically coupled to the third TSV 136c; and so forth.

Also shown in the various views 1300a-1300b of FIGS. 13A-13B, a fourth plurality of conductive bond structures 323 are formed in the dielectric structure 320. The fourth plurality of conductive bond structures 323 are formed electrically coupled to the third plurality of conductive vias 322, respectively. For example, a first conductive bond structure 323a of the fourth plurality of conductive bond structures 323 is formed electrically coupled to the first conductive via 322a of the third plurality of conductive vias 322; a second conductive bond structure 323b of the fourth plurality of conductive bond structures 323 is formed electrically coupled to the second conductive via of the third plurality of conductive vias 322; a third conductive bond structure 323c of the fourth plurality of conductive bond structures 323 is formed electrically coupled to the third conductive via of the third plurality of conductive vias 322; and so forth.

In some embodiments, a process for forming the dielectric structure 320, the third plurality of conductive vias 322, and the fourth plurality of conductive bond structures 323 comprises forming a first dielectric layer on the back side 117b of the second semiconductor substrate 117, on the plurality of TSVs 136, and on the plurality of dielectric liner structures 1202. The first dielectric layer may be or comprise, for example, a low-k dielectric (e.g., a dielectric material with a dielectric constant less than about 3.9), an oxide (e.g., $SiO_2$), or the like. The first dielectric layer may be formed by, for example, CVD, PVD, ALD, a spin-on process, some other deposition process, or a combination of the foregoing.

Thereafter, a patterned masking layer (e.g., positive/negative photoresist, hardmask, etc.) is formed on the first dielectric layer. With the patterned masking layer in place, an etching process (e.g., a wet etching process, dry etching process, RIE process, or the like) is performed on the first dielectric layer, thereby forming a first plurality of openings (not shown) in the first dielectric layer according to the patterned masking layer. Subsequently, the patterned masking layer is stripped away (e.g., via a plasma ashing process). A metal material is then deposited on the first dielectric layer and in the first plurality of openings. The metal material may be or comprise, for example, copper (Cu), aluminum (Al), tungsten (W), gold (Au), some other conductive material, or a combination of the foregoing. The metal material may be deposited by, for example, CVD, PVD, ALD, sputtering, electrochemical plating, electroless plating, some other deposition process, or a combination of the foregoing. Thereafter, a planarization process (e.g., CMP) is performed on the metal material to remove a portion of the metal material, thereby leaving remaining portions of the metal material in the first plurality of openings as the third plurality of conductive vias 322.

Thereafter, a second dielectric layer is formed on the first dielectric layer and on the third plurality of conductive vias 322. The second dielectric layer may be or comprise, for example, a low-k dielectric (e.g., a dielectric material with a dielectric constant less than about 3.9), an oxide (e.g., $SiO_2$), or the like. The second dielectric layer may be formed by, for example, CVD, PVD, ALD, a spin-on process, some other deposition process, or a combination of the foregoing.

Thereafter, a patterned masking layer (e.g., positive/negative photoresist, hardmask, etc.) is formed on the second dielectric layer. With the patterned masking layer in place, an etching process (e.g., a wet etching process, dry etching process, RIE process, or the like) is performed on the second dielectric layer, thereby forming a second plurality of openings (not shown) in the second dielectric layer according to the patterned masking layer. Subsequently, the patterned masking layer is stripped away (e.g., via a plasma ashing process). A metal material is then deposited on the second dielectric layer and in the second plurality of openings. The metal material may be or comprise, for example, copper (Cu), aluminum (Al), tungsten (W), gold (Au), some other conductive material, or a combination of the foregoing. The metal material may be deposited by, for example, CVD, PVD, ALD, sputtering, electrochemical plating, electroless plating, some other deposition process, or a combination of the foregoing. Thereafter, a planarization process (e.g., CMP) is performed on the metal material to remove a portion of the metal material, thereby leaving remaining portions of the metal material in the second plurality of openings as the fourth plurality of conductive bond structures 323. In some embodiments, forming the fourth plurality of conductive bond structures 323 completes formation of the dielectric structure 320, which may comprise the first dielectric layer and the second dielectric layer. In further embodiments, forming the fourth plurality of conductive bond structures 323 and the dielectric structure 320 completes formation of a second chip 104.

Figure 14A:
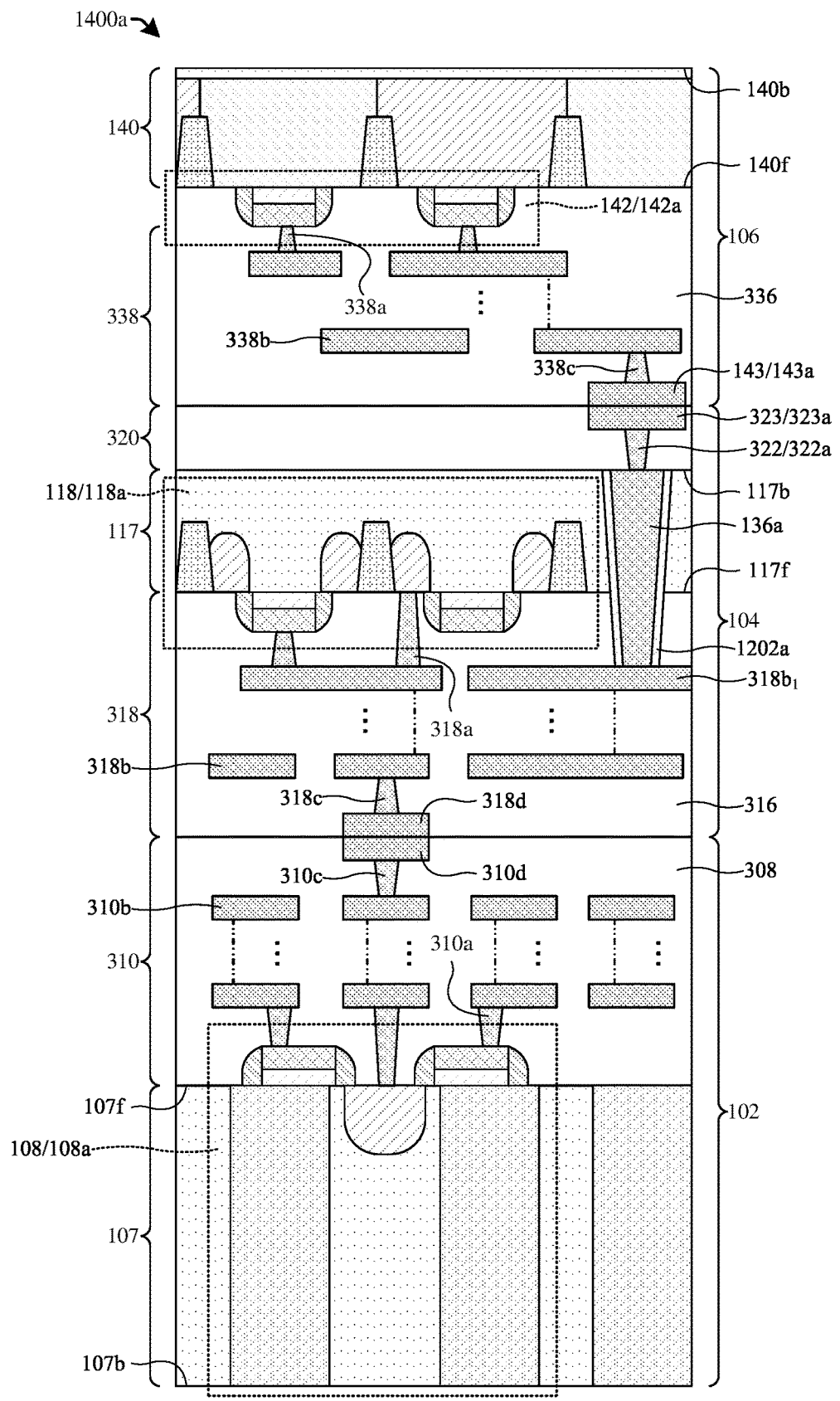
Figure 14B:
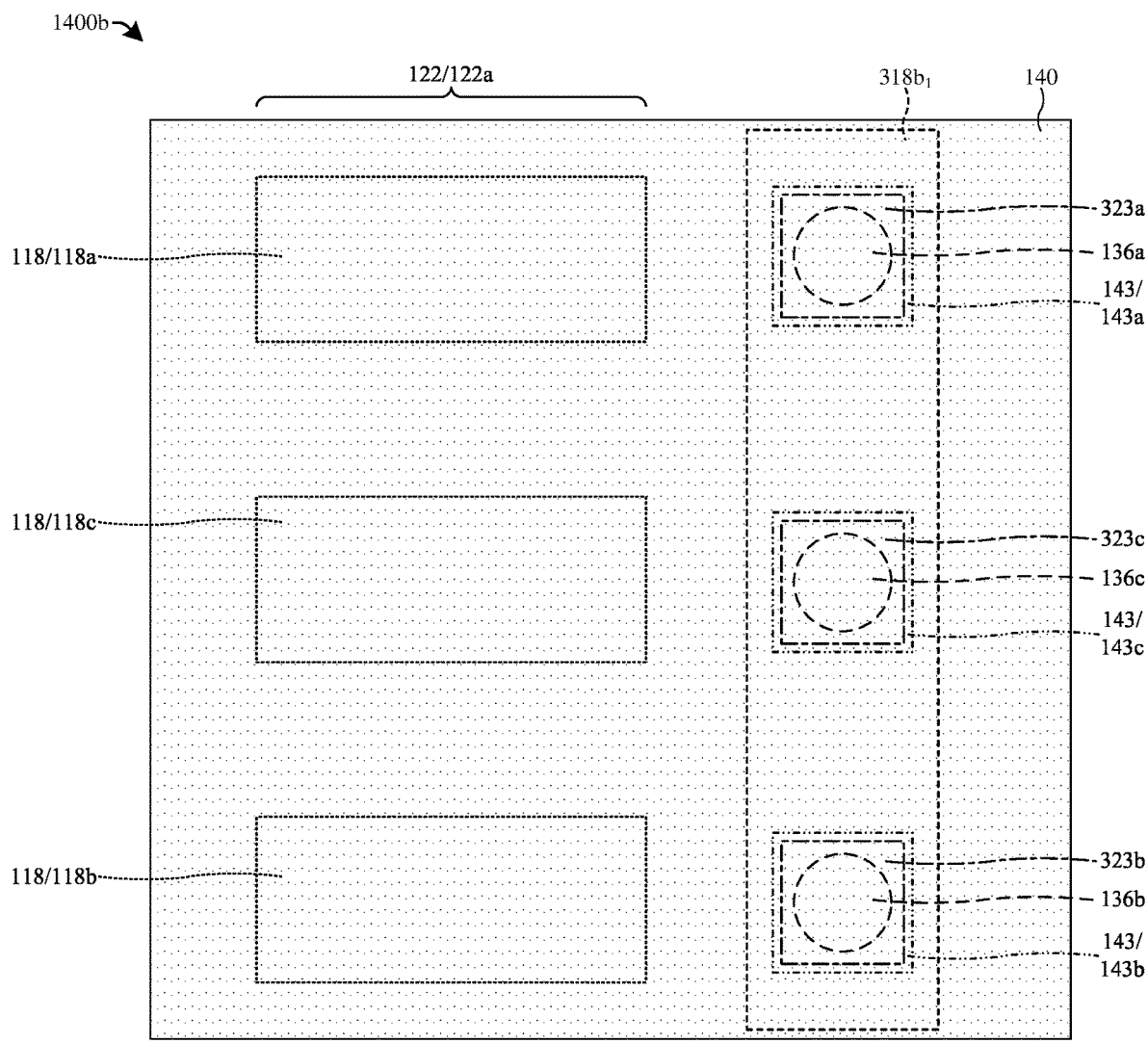

As shown in the various views 1400a-1400b of FIGS. 14A-14B, a third chip 106 is bonded to the second chip 104. The third chip 106 comprises a third semiconductor substrate 140. The third semiconductor substrate 140 has a front side 140f and a back side 140b. In some embodiments, the third chip 106 comprises a first plurality of readout circuits 142. In other embodiments, the third chip 106 comprises a second plurality of readout circuits 902. In further embodiments, each of the first plurality of readout circuits 142 may comprise an amplifier circuit and/or an ADC (see, e.g., FIG. 1). The third chip 106 also comprises a third ILD structure 336 disposed along the front side 140f of the third semiconductor substrate 140. A third interconnect structure 338 is disposed in the third ILD structure 336. The third interconnect structure 338 comprises a third plurality of conductive contacts 338a, a third plurality of conductive wires 338b, a fourth plurality of conductive vias 338c, and the first plurality of conductive bond structures 143.

In some embodiments, a process for bonding the third chip 106 to the second chip 104 comprises bonding the first plurality of conductive bond structures 143 respectively to the fourth plurality of conductive bond structures 323. For example, the first conductive bond structure 143a is bonded to the first conductive bond structure 323a; the second conductive bond structure 143b is bonded to the second conductive bond structure 323b; and the third conductive bond structure 143c is bonded to the third conductive bond structure 323c; and so forth. In further embodiments, the process for bonding the third chip 106 to the second chip 104 may comprise bonding the third ILD structure 336 to the dielectric structure 320.

In some embodiments, the third chip 106 is bonded to the second chip 104 so that the second semiconductor substrate 117 is disposed vertically between the third ILD structure 336 and the second ILD structure 316. In some embodiments, the third chip 106 is bonded to the second chip 104 so that the first plurality of conductive bond structures 143 are respectively electrically coupled to the fourth plurality of conductive bond structures 323. In yet further embodiments, the third chip 106 may be bonded to the second chip 104 by, for example, a dielectric-to-dielectric and a metal-to-metal bonding process (e.g., a bonding process that forms one or more dielectric-to-dielectric interfaces and one or more metal-to-metal interfaces), a eutectic bonding process, or some other bonding process.

For clarity, it will be appreciated that spatially relative terms (e.g., over, under, upper, lower, etc.) used herein to describe the structures illustrated in the figures are generally based on the orientation of such structures as illustrated in their respective figures. For example, in describing the structure illustrated in FIG. 14, it may be said that the third chip 106 overlies the second chip 104. On the other hand, in describing the structure illustrated in FIG. 3, it may be said that the second chip 104 overlies the third chip 106.

Figure 15:
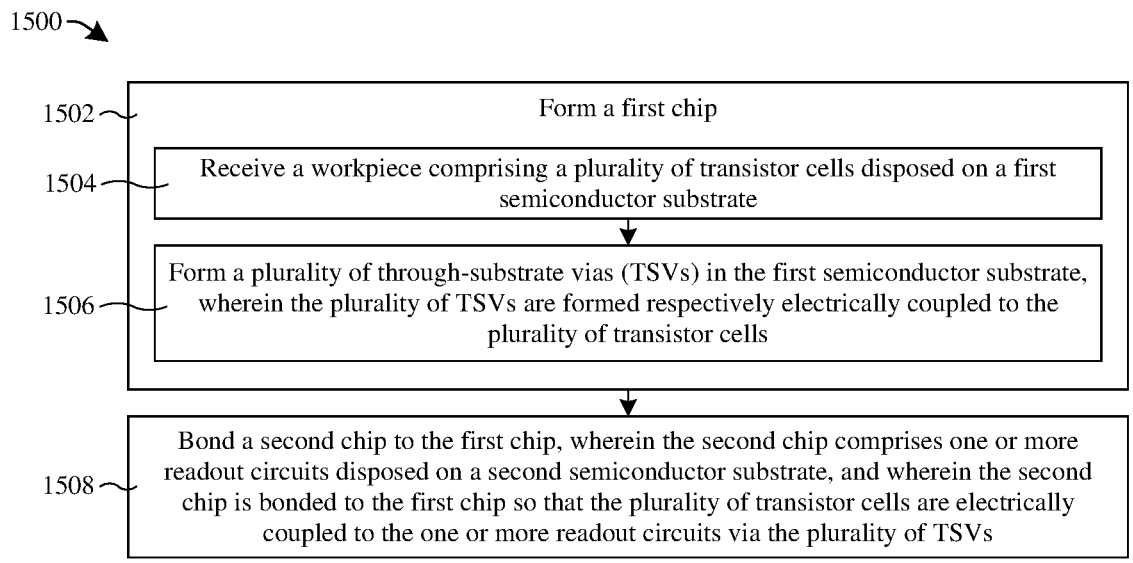
FIG. 15 illustrates a flowchart of some embodiments of a method for forming a high-speed readout image sensor.

FIG. 15 illustrates a flowchart 1500 of some embodiments of a method for forming a high-speed readout image sensor. While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1502, a first chip is formed. FIGS. 10A-10B through FIGS. 13A-13B illustrate a series of various views of some embodiments corresponding to act 1502. In some embodiments, act 1502 comprises act 1504 and act 1506.

At act 1504, a workpiece is received. The workpiece comprises a plurality of transistor cells that are disposed on a first semiconductor substrate. FIGS. 10A-10B illustrate various views 1000a-1000b of some embodiments corresponding to act 1504.

At act 1506, a plurality of through-substrate vias (TSVs) are formed in the first semiconductor substrate. The plurality of TSVs are formed respectively electrically coupled to the plurality of transistor cells. FIGS. 11A-11B through FIGS. 12A-12B illustrate a series of various views of some embodiments corresponding to act 1506.

At act 1508, a second chip is bonded to the first chip. The second chip comprises one or more readout circuits disposed on a second semiconductor substrate. The second chip is bonded to the first chip so that the plurality of transistor cells are electrically coupled to the one or more readout circuits via the plurality of TSVs. FIGS. 14A-14B illustrate various views 1400a-1400b of some embodiments corresponding to act 1508.

In some embodiments, the present application provides an image sensor. The image sensor comprises a first chip. The first chip comprises a first semiconductor substrate, wherein the first semiconductor substrate has a first side and a second side, and wherein the second side of the first semiconductor substrate is opposite the first side of the first semiconductor substrate. The first chip comprises a first transistor cell and a second transistor cell that are disposed in a transistor cell array, wherein the first transistor cell comprises a first plurality of transistors disposed along the first side of the first semiconductor substrate, wherein the first transistor cell is configured to operate a first photodetector cell, wherein the second transistor cell comprises a second plurality of transistors disposed along the first side of the first semiconductor substrate, wherein the second transistor cell is configured to operate a second photodetector cell, and wherein the second transistor cell is laterally spaced from the first transistor cell. The first chip comprises a first through-substrate via (TSV) that extends vertically through the first semiconductor substrate, wherein the first transistor cell is electrically coupled to the first TSV, wherein the first transistor cell is configured to provide a first signal to the first TSV that corresponds to a number of charges accumulated in a photodetector of the first photodetector cell. The first chip comprises a second TSV that extends vertically through the first semiconductor substrate, wherein the second transistor cell is electrically coupled to the second TSV, wherein the second transistor cell is configured to provide a second signal to the second TSV that corresponds to a number of charges accumulated in a photodetector of the second photodetector cell. The image sensor comprises a second chip. The second chip comprises a second semiconductor substrate, wherein the second chip is bonded to the first chip. The second chip comprises a first interlayer dielectric (ILD) structure that is disposed vertically between the second semiconductor substrate and first semiconductor substrate, and wherein the first side of the first semiconductor substrate is disposed vertically between the second side of the first semiconductor substrate and the second semiconductor substrate. The second chip comprises a first readout circuit that is electrically coupled to the first TSV and to the second TSV, wherein the first readout circuit is disposed laterally, at least partially, between the first TSV and the second TSV.

In some embodiments, the first readout circuit Comprises a first part that is within the second chip and a second part that is within a third chip bonded to the second chip.

In some embodiments, the first readout circuit comprises an amplifier circuit comprising one or more first readout devices disposed on the second semiconductor substrate.

In further embodiments, the one or more first readout devices are disposed laterally between the first TSV and the second TSV.

In some embodiments, the first transistor cell comprises a first select transistor; a source/drain region of the first select transistor is electrically coupled to the first TSV; the second transistor cell comprises a second select transistor; and a source/drain region of the second select transistor is electrically coupled to the second TSV.

In some embodiments, the first TSV is laterally spaced from the first transistor cell and the second transistor cell by at least about 0.1 micrometers; and the second TSV is laterally spaced from the first transistor cell and the second transistor cell by at least about 0.1 micrometers.

In some embodiments, the image sensor further comprises a third chip. The third chip comprises a third semiconductor substrate, wherein the third chip is bonded to the first chip, wherein the photodetector of the first photodetector cell and the photodetector of the second photodetector cell are both disposed in the third semiconductor substrate, and wherein the first chip is disposed vertically between the second chip and the third chip.

In some embodiments, the transistor cell array comprises a plurality of transistor cells; the transistor cell array comprises a plurality of rows and a plurality of columns; the first transistor cell is one transistor cell of the plurality of transistor cells; the second transistor cell is another transistor cell of the plurality of transistor cells; and both the first transistor cell and the second transistor cell are disposed in a first column of the plurality of columns.

In further embodiments, the first transistor cell neighbors the second transistor cell.

In further embodiments, the first transistor cell is spaced further from the second transistor cell than any other transistor cell of the plurality of transistor cells that are disposed in the first column.

In further embodiments, the first readout circuit is spaced laterally from the first transistor cell by a first distance; the first readout circuit is spaced laterally from the second transistor cell by a second distance; and the first distance is about the same as the second distance.

In some embodiments, the second chip comprises a second readout circuit electrically coupled to the second TSV; the second readout circuit is configured to receive the second signal; and the second readout circuit is laterally spaced from the first readout circuit.

In further embodiments, the transistor cell array comprises a plurality of transistor cells; the transistor cell array comprises a plurality of rows and a plurality of columns; the first transistor cell is one transistor cell of the plurality of transistor cells; the second transistor cell is another transistor cell of the plurality of transistor cells; the plurality of transistor cells comprises a third transistor cell; the plurality of transistor cells comprises a fourth transistor cell; each of the first transistor cell, the second transistor cell, the third transistor cell, and the fourth transistor cell are disposed in a first column of the plurality of columns; the third transistor cell is spaced further from the fourth transistor cell than any other transistor cells of the plurality of transistor cells that are disposed in the first column; and both the first readout circuit and the second readout circuit are disposed laterally between the third transistor cell and the fourth transistor cell.

In some embodiments, the present application provides an image sensor. The image sensor comprises a first chip. The first chip comprises a first semiconductor substrate. The first chip comprises a first transistor cell and a second transistor cell that are disposed in a transistor cell array, wherein the first transistor cell comprises a first plurality of transistors disposed on the first semiconductor substrate, wherein the first transistor cell is configured to operate a first photodetector cell, wherein the second transistor cell comprises a second plurality of transistors disposed on the first semiconductor substrate, wherein the second transistor cell is configured to operate a second photodetector cell, and wherein a first region of the first chip laterally separates the second transistor cell from the first transistor cell. The first chip comprises a first readout circuit that is electrically coupled to the first transistor cell, wherein the first transistor cell is configured to provide a first signal to the first readout circuit that corresponds to a number of charges accumulated in a photodetector of the first photodetector cell, and wherein the first readout circuit is disposed within a perimeter of the first region of the first chip. The first chip comprises a first interlayer dielectric (ILD) structure that is disposed along a side of the first semiconductor substrate. The first chip comprises a first through-substrate via (TSV) that is disposed in the first semiconductor substrate and, at least partially, in the first ILD structure, wherein the first TSV extends vertically through the first semiconductor substrate, wherein the first TSV is electrically coupled to the first readout circuit, and wherein the first readout circuit is configured to provide a second signal to the first TSV that is based on the first signal. The image sensor comprises a second chip. The second chip comprises a second semiconductor substrate, wherein the second chip is bonded to the first chip. The second chip comprises a second ILD structure, wherein the second semiconductor substrate is disposed vertically between the first ILD structure and the second ILD structure. The second chip comprises a second readout circuit electrically coupled to the first TSV, wherein the second readout circuit is configured to receive the second signal and output a third signal that is based on the second signal.

In some embodiments, the first transistor cell comprises a first isolation structure that is disposed in the first semiconductor substrate; the second transistor cell comprises a second isolation structure that is disposed in the first semiconductor substrate; a sidewall of the first isolation structure faces a sidewall of the second isolation structure; and the sidewall of the first isolation structure and the sidewall of the second isolation structure define, at least partially, the perimeter of the first region of the first chip.

In some embodiments, the first chip comprises a third readout circuit electrically coupled to the second transistor cell; the second transistor cell is configured to provide a fourth signal to the third readout circuit that corresponds to a number of charges accumulated in a photodetector of the second photodetector cell; the third readout circuit is disposed within a perimeter of a second region of the first chip; the second transistor cell laterally separates the second region of the first chip from the first region of the first chip; the first chip comprises a second TSV disposed in the first semiconductor substrate and, at least partially, in the first ILD structure; the second TSV extends vertically through the first semiconductor substrate; the second TSV is disposed within the perimeter of the second region of the first chip; the second TSV is electrically coupled to the third readout circuit; the second readout circuit is electrically coupled to the second TSV; the third readout circuit is configured to provide a fifth signal to the second TSV that is based on the fourth signal; and the second readout circuit is configured to receive the fifth signal and output a sixth signal that is based on the fifth signal.

In some embodiments, the second chip comprises a conductive wire disposed in the second ILD structure; a first portion of the conductive wire is disposed between the first TSV and the second readout circuit; the first TSV is electrically coupled to the second readout circuit via the first portion of the conductive wire; a second portion of the conductive wire is disposed between the second TSV and the second readout circuit; and the second TSV is electrically coupled to the second readout circuit via the second portion of the conductive wire.

In some embodiments, the image sensor further comprises a third chip. The third chip comprises a third semiconductor substrate, wherein the third chip is bonded to the first chip, wherein the photodetector of the first photodetector cell is disposed in the third semiconductor substrate, and wherein the first chip is disposed vertically between the second chip and the third chip.

In some embodiments, the present application provides an image sensor. The image sensor includes a first chip having a plurality of transistor cells disposed within rows and columns of a transistor cell array, the plurality of transistor cells respectively including a plurality of transistors configured to operate a photodetector cell; a second chip having a plurality of readout circuits; and a plurality of through-substrate vias (TSVs) extending through the first chip, wherein the plurality of TSVs including a first group of multiple TSVs that are arranged within a first row of the transistor cell array and that are configured to electrically couple a first group of the plurality of transistor cells within the first row to one or more first readout circuits of the plurality of readout circuits; and a second group of multiple TSVs that are arranged within a second row of the transistor cell array that are configured to electrically couple a second group of the plurality of transistor cells within the second row to one or more second readout circuits of the plurality of readout circuits.

In some embodiments, the plurality of transistor cells include a first transistor cell having a first isolation structure that is disposed in a first semiconductor substrate; a second transistor cell having a second isolation structure that is disposed in the first semiconductor substrate; a sidewall of the first isolation structure facing a sidewall of the second isolation structure; and the sidewall of the first isolation structure and the sidewall of the second isolation structure defining, at least partially, a perimeter of a first region of the first chip, at least one of the plurality of readout circuits disposed within the perimeter of the first region of the first chip.

In some embodiments, each of the plurality of transistor cells is coupled to a separate readout circuit of the plurality of readout circuits by way of a separate TSV of the plurality of TSVs.

In some embodiments a number of the plurality of readout circuits in the second chip is equal to a number of the plurality of TSVs.

In some embodiments, the image sensor further includes a third chip having a third semiconductor substrate, the third chip being bonded to the first chip, a photodetector of a first photodetector cell being disposed in the third semiconductor substrate, and the first chip being disposed vertically between the second chip and the third chip.

In some embodiments, the present application provides a method for forming an image sensor. The method comprises forming a first chip. Forming the first chip comprises receiving a workpiece. The workpiece comprises: a first transistor cell disposed on a first semiconductor substrate; a second transistor cell disposed on the first semiconductor substrate, wherein the second transistor cell is laterally spaced from the first transistor cell; a first interlayer dielectric (ILD) structure disposed along a first side of the first semiconductor substrate; and a conductive wire disposed in the first ILD structure, wherein the first transistor cell and the second transistor cell are both electrically coupled to the conductive wire. An opening is formed in the first semiconductor substrate and in the first ILD structure, wherein the opening exposes a portion of the conductive wire that is disposed laterally between the first transistor cell and the second transistor cell. A through-substrate via (TSV) is formed in the opening, wherein the TSV is formed electrically coupled to the conductive wire. A second chip is bonded to the first chip. The second chip comprises a second semiconductor substrate and a second ILD structure. The second chip comprises a readout circuit comprising an amplifier circuit. The second chip comprises a first bond pad that is electrically coupled to the amplifier circuit. The second chip is bonded to the first chip so that the first semiconductor substrate is vertically between the second ILD structure and the first ILD structure. The second chip is bonded to the first chip so that the TSV is electrically coupled to the first bond pad.

In some embodiments, forming the first chip further comprises forming a dielectric structure along a second side of the first semiconductor substrate, wherein the second side of the first semiconductor substrate is opposite the first side of the first semiconductor substrate. Forming the first chip further comprises forming a second bond pad in the dielectric structure. The second chip is bonded to the first chip so that the first bond pad is bonded to the second bond pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
a first chip comprising:
   a first semiconductor substrate, wherein the first semiconductor substrate has a first side and a second side, and wherein the second side of the first semiconductor substrate is opposite the first side of the first semiconductor substrate;
   a first transistor cell and a second transistor cell disposed in a transistor cell array, wherein the first transistor cell comprises a first plurality of transistors disposed along the first side of the first semiconductor substrate, wherein the first transistor cell is configured to operate a first photodetector cell, wherein the second transistor cell comprises a second plurality of transistors disposed along the first side of the first semiconductor substrate, wherein the second transistor cell is configured to operate a second photodetector cell, and wherein the second transistor cell is laterally spaced from the first transistor cell;
   a first through-substrate via (TSV) extending vertically through the first semiconductor substrate, wherein the first transistor cell is electrically coupled to the first TSV, wherein the first transistor cell is configured to provide a first signal to the first TSV that corresponds to a number of charges accumulated in a photodetector of the first photodetector cell; and
   a second TSV extending vertically through the first semiconductor substrate, wherein the second transistor cell is electrically coupled to the second TSV, wherein the second transistor cell is configured to provide a second signal to the second TSV that corresponds to a number of charges accumulated in a photodetector of the second photodetector cell;
a second chip comprising:
   a second semiconductor substrate, wherein the second chip is bonded to the first chip;
   a first interlayer dielectric (ILD) structure disposed vertically between the second semiconductor substrate and the first semiconductor substrate, and wherein the first side of the first semiconductor substrate is disposed vertically between the second side of the first semiconductor substrate and the second semiconductor substrate; and
   a first readout circuit electrically coupled to the first TSV and to the second TSV, wherein the first readout circuit is disposed laterally, at least partially, between the first TSV and the second TSV.

2. The image sensor of claim 1, wherein the first readout circuit comprises a first part that is within the second chip and a second part that is within a third chip bonded to the second chip.

3. The image sensor of claim 1, wherein the first readout circuit comprises an amplifier circuit comprising one or more first readout devices disposed on the second semiconductor substrate.

4. The image sensor of claim 3, wherein the one or more first readout devices are disposed laterally between the first TSV and the second TSV.

5. The image sensor of claim 1, wherein:
the first transistor cell comprises a first select transistor;
a source/drain region of the first select transistor is electrically coupled to the first TSV;
the second transistor cell comprises a second select transistor; and
a source/drain region of the second select transistor is electrically coupled to the second TSV.

6. The image sensor of claim 1, wherein:
the first TSV is laterally spaced from the first transistor cell and the second transistor cell by at least about 0.1 micrometers; and
the second TSV is laterally spaced from the first transistor cell and the second transistor cell by at least about 0.1 micrometers.

7. The image sensor of claim 1, further comprising:
a third chip comprising:
   a third semiconductor substrate, wherein the third chip is bonded to the first chip, wherein the photodetector of the first photodetector cell and the photodetector of the second photodetector cell are both disposed in the third semiconductor substrate, and wherein the first chip is disposed vertically between the second chip and the third chip.

8. The image sensor of claim 1, wherein:
the transistor cell array comprises a plurality of transistor cells;

the transistor cell array comprises a plurality of rows and a plurality of columns;

the first transistor cell is one transistor cell of the plurality of transistor cells;

the second transistor cell is another transistor cell of the plurality of transistor cells; and both the first transistor cell and the second transistor cell are disposed in a first column of the plurality of columns.

9. The image sensor of claim 8, wherein the first transistor cell neighbors the second transistor cell.

10. The image sensor of claim 8, wherein the first transistor cell is spaced further from the second transistor cell than any other transistor cell of the plurality of transistor cells that are disposed in the first column.

11. The image sensor of claim 8, wherein:
the first readout circuit is spaced laterally from the first transistor cell by a first distance;
the first readout circuit is spaced laterally from the second transistor cell by a second distance; and
the first distance is about the same as the second distance.

12. The image sensor of claim 1, wherein:
the second chip comprises a second readout circuit electrically coupled to the second TSV;
the second readout circuit is configured to receive the second signal; and
the second readout circuit is laterally spaced from the first readout circuit.

13. The image sensor of claim 12, wherein:
the transistor cell array comprises a plurality of transistor cells;
the transistor cell array comprises a plurality of rows and a plurality of columns;
the first transistor cell is one transistor cell of the plurality of transistor cells;
the second transistor cell is another transistor cell of the plurality of transistor cells;
the plurality of transistor cells comprises a third transistor cell;
the plurality of transistor cells comprises a fourth transistor cell;
each of the first transistor cell, the second transistor cell, the third transistor cell, and the fourth transistor cell are disposed in a first column of the plurality of columns;
the third transistor cell is spaced further from the fourth transistor cell than any other transistor cells of the plurality of transistor cells that are disposed in the first column; and
both the first readout circuit and the second readout circuit are disposed laterally between the third transistor cell and the fourth transistor cell.

14. An image sensor comprising:
a first chip comprising a plurality of transistor cells disposed within rows and columns of a transistor cell array, wherein the plurality of transistor cells respectively comprise a plurality of transistors configured to operate a photodetector cell;
a second chip comprising a plurality of readout circuits; and
a plurality of through-substrate vias (TSVs) extending through the first chip, wherein the plurality of TSVs comprise:
a first group of multiple TSVs that are arranged within a first row of the transistor cell array and that are configured to electrically couple a first group of the plurality of transistor cells within the first row to one or more first readout circuits of the plurality of readout circuits; and
a second group of multiple TSVs that are arranged within a second row of the transistor cell array that are configured to electrically couple a second group of the plurality of transistor cells within the second row to one or more second readout circuits of the plurality of readout circuits.

15. The image sensor of claim 14, wherein the plurality of transistor cells comprise:
a first transistor cell comprising a first isolation structure that is disposed in a first semiconductor substrate; and
a second transistor cell comprising a second isolation structure that is disposed in the first semiconductor substrate;
wherein a sidewall of the first isolation structure faces a sidewall of the second isolation structure; and
wherein the sidewall of the first isolation structure and the sidewall of the second isolation structure define, at least partially, a perimeter of a first region of the first chip, at least one of the plurality of readout circuits disposed within the perimeter of the first region of the first chip.

16. The image sensor of claim 14, wherein each of the plurality of transistor cells is coupled to a separate readout circuit of the plurality of readout circuits by way of a separate TSV of the plurality of TSVs.

17. The image sensor of claim 16, wherein a number of the plurality of readout circuits in the second chip is equal to a number of the plurality of TSVs.

18. The image sensor of claim 14, further comprising:
a third chip comprising:
a third semiconductor substrate, wherein the third chip is bonded to the first chip, wherein a photodetector of a first photodetector cell is disposed in the third semiconductor substrate, and wherein the first chip is disposed vertically between the second chip and the third chip.

19. A method for forming an image sensor, the method comprising:
forming a first chip, wherein forming the first chip comprises:
receiving a workpiece, wherein the workpiece comprises:
a first transistor cell disposed on a first semiconductor substrate;
a second transistor cell disposed on the first semiconductor substrate,
wherein the second transistor cell is laterally spaced from the first transistor cell;
a first interlayer dielectric (ILD) structure disposed along a first side of the first semiconductor substrate;
a conductive wire disposed in the first ILD structure, wherein the first transistor cell and the second transistor cell are both electrically coupled to the conductive wire;
forming an opening in the first semiconductor substrate and in the first ILD structure, wherein the opening exposes a portion of the conductive wire that is disposed laterally between the first transistor cell and the second transistor cell; and
forming a through-substrate via (TSV) in the opening, wherein the TSV is formed electrically coupled to the conductive wire;
bonding a second chip to the first chip, wherein:

the second chip comprises a second semiconductor substrate and a second ILD structure;

the second chip comprises a readout circuit comprising an amplifier circuit;

the second chip comprises a first bond pad that is electrically coupled to the amplifier circuit;

the second chip is bonded to the first chip so that the first semiconductor substrate is vertically between the second ILD structure and the first ILD structure; and the second chip is bonded to the first chip so that the TSV is electrically coupled to the first bond pad.

20. The method of claim 19, wherein:

forming the first chip further comprises forming a dielectric structure along a second side of the first semiconductor substrate, wherein the second side of the first semiconductor substrate is opposite the first side of the first semiconductor substrate;

forming the first chip further comprises forming a second bond pad in the dielectric structure; and the second chip is bonded to the first chip so that the first bond pad is bonded to the second bond pad.

* * * * *